United States Patent
Yamazaki

(10) Patent No.: US 12,473,648 B2
(45) Date of Patent: Nov. 18, 2025

(54) SUBSTRATE PROCESSING APPARATUS, SUBSTRATE PROCESSING METHOD, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventor: Hirohisa Yamazaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 476 days.

(21) Appl. No.: 17/990,236

(22) Filed: Nov. 18, 2022

(65) Prior Publication Data

US 2023/0081219 A1    Mar. 16, 2023

Related U.S. Application Data

(63) Continuation of application No. 17/476,132, filed on Sep. 15, 2021, now Pat. No. 11,542,603.

(30) Foreign Application Priority Data

Sep. 23, 2020    (JP) .................................. 2020-158290

(51) Int. Cl.
    *C23C 16/458*    (2006.01)
    *C23C 16/30*    (2006.01)
    (Continued)

(52) U.S. Cl.
    CPC ........ *C23C 16/4583* (2013.01); *C23C 16/308* (2013.01); *C23C 16/34* (2013.01);
    (Continued)

(58) Field of Classification Search
    None
    See application file for complete search history.

(56) References Cited

U.S. PATENT DOCUMENTS

| | | | | |
|---|---|---|---|---|
| 5,506,389 A | * | 4/1996 | Hidano | ................. F27D 1/0036 219/390 |
| 5,616,264 A | * | 4/1997 | Nishi | ..................... C23C 16/46 219/486 |

(Continued)

FOREIGN PATENT DOCUMENTS

| | | |
|---|---|---|
| JP | 10-223538 A | 8/1998 |
| JP | 2012-094652 A | 5/2012 |

(Continued)

OTHER PUBLICATIONS

Notice of Reasons for Refusal in priority Japanese Application No. 2020-158290, issued Jul. 15, 2022, with English translation, 12 pages.

(Continued)

*Primary Examiner* — Jethro M. Pence
(74) *Attorney, Agent, or Firm* — Edell, Shapiro & Finnan, LLC

(57) ABSTRACT

Described herein is a technique capable of suppressing an adhesion of deposits to an inside of a reaction vessel of a substrate processing apparatus. According to one aspect, there is provided a substrate processing apparatus including: a substrate retainer provided with a substrate support region; a heat insulator provided below the substrate support region; and a reaction vessel of a cylindrical shape in which the substrate retainer and the heat insulator are accommodated, wherein the reaction vessel includes: an auxiliary chamber protruding outward in a radial direction of the reaction vessel and extending along an extending direction from at least a position below an upper end of the heat insulator to a position facing the substrate support region; and a first (Continued)

cover provided in the auxiliary chamber along a plane perpendicular to the extending direction of the auxiliary chamber so as to divide an inner space of the auxiliary chamber.

14 Claims, 9 Drawing Sheets

(51) Int. Cl.
  *C23C 16/34* (2006.01)
  *C23C 16/40* (2006.01)
  *C23C 16/46* (2006.01)
  *H01J 37/32* (2006.01)

(52) U.S. Cl.
  CPC .......... *C23C 16/345* (2013.01); *C23C 16/401* (2013.01); *C23C 16/403* (2013.01); *C23C 16/46* (2013.01); *H01J 37/3244* (2013.01); *H01J 2237/006* (2013.01)

(56) References Cited

U.S. PATENT DOCUMENTS

| | | | | |
|---|---|---|---|---|
| 5,622,639 | A * | 4/1997 | Kitayama | C23C 16/46 219/400 |
| 5,709,543 | A * | 1/1998 | Shimazu | C23C 16/4583 432/5 |
| 6,228,174 | B1 * | 5/2001 | Takahashi | C23C 16/46 118/724 |
| 8,028,652 | B2 * | 10/2011 | Toyoda | H01L 21/67109 156/345.43 |
| 8,833,298 | B2 * | 9/2014 | Sato | C23C 16/44 118/712 |
| 8,882,923 | B2 * | 11/2014 | Saido | C23C 16/46 118/728 |
| 9,082,694 | B2 * | 7/2015 | Saido | C23C 16/46 |
| 9,255,331 | B2 * | 2/2016 | Tanaka | C23C 18/1632 |
| 9,460,946 | B2 * | 10/2016 | Murata | C23C 16/463 |
| 10,032,626 | B2 * | 7/2018 | Noda | C23C 16/4412 |
| 10,340,151 | B2 * | 7/2019 | Kosugi | H01L 21/67109 |
| 10,508,336 | B2 * | 12/2019 | Nakada | C23C 16/54 |
| 10,570,508 | B2 * | 2/2020 | Takagi | C23C 16/24 |
| 10,593,572 | B2 * | 3/2020 | Saido | C23C 16/52 |
| 10,714,362 | B2 * | 7/2020 | Saido | H01L 21/67103 |
| 11,104,997 | B2 * | 8/2021 | Miyashita | H01L 21/02211 |
| 11,300,456 | B2 * | 4/2022 | Osaka | G01K 1/14 |
| 11,367,633 | B2 * | 6/2022 | Yamaguchi | C23C 16/4584 |
| 11,384,434 | B2 * | 7/2022 | Saido | C23C 16/345 |
| 11,396,700 | B2 * | 7/2022 | Hisakado | C23C 16/46 |
| 11,495,477 | B2 * | 11/2022 | Saido | C23C 16/45546 |
| 11,512,392 | B2 * | 11/2022 | Nakada | C23C 16/4401 |
| 11,542,603 | B2 * | 1/2023 | Yamazaki | C23C 16/46 |
| 11,685,992 | B2 * | 6/2023 | Okajima | H01L 21/67103 156/345.29 |
| 12,050,138 | B2 * | 7/2024 | Osaka | G01K 1/14 |
| 12,123,091 | B2 * | 10/2024 | Nakada | H01L 21/02365 |
| 12,344,935 | B2 * | 7/2025 | Sato | C23C 16/4411 |
| 2009/0078201 | A1 * | 3/2009 | Matsuura | C23C 16/45574 118/723 E |
| 2011/0306212 | A1 * | 12/2011 | Sato | C23C 16/325 156/345.24 |
| 2012/0100722 | A1 | 4/2012 | Asai et al. | |
| 2012/0247391 | A1 * | 10/2012 | Endo | C23C 16/4583 118/724 |
| 2014/0256152 | A1 | 9/2014 | Ogawa | |
| 2018/0187307 | A1 | 7/2018 | Yoshida et al. | |
| 2019/0360098 | A1 | 11/2019 | Shimada et al. | |
| 2020/0240019 | A1 | 7/2020 | Yoshida et al. | |
| 2020/0294790 | A1 | 9/2020 | Nagatomi et al. | |
| 2021/0207265 | A1 | 7/2021 | Shimada et al. | |
| 2021/0246554 | A1 | 8/2021 | Shimada et al. | |
| 2023/0081219 | A1 * | 3/2023 | Yamazaki | C23C 16/345 438/758 |
| 2024/0060184 | A1 * | 2/2024 | Miura | H01L 21/683 |
| 2024/0379483 | A1 * | 11/2024 | Saido | H01L 21/67098 |
| 2025/0118579 | A1 * | 4/2025 | Akao | H01L 21/67109 |
| 2025/0215561 | A1 * | 7/2025 | Okajima | C23C 16/4585 |

FOREIGN PATENT DOCUMENTS

| | | |
|---|---|---|
| JP | 2018-166142 A | 10/2018 |
| JP | 2019-203182 A | 11/2019 |
| KR | 10-2012-0105339 A | 9/2012 |
| TW | 202004878 A | 1/2020 |
| WO | 2013/054652 A1 | 4/2013 |
| WO | 2017/037937 A1 | 3/2017 |
| WO | 2016/046947 A1 | 8/2017 |
| WO | 2020066829 A1 | 4/2020 |

OTHER PUBLICATIONS

Office Action with English translation in Taiwan Application No. 110134341, issued Jul. 14, 2022, 13 pages.
Request for the Submission of an Opinion with English translation in Korean Application No. 10-2021-0121583, dated Dec. 23, 2023, 16 pages.
Notice of First Examination Opinion with English translation in Chinese Application No. 202111095413.9, dated Sep. 6, 2023, 10 pages.

* cited by examiner

SUBSTRATE PROCESSING APPARATUS, SUBSTRATE PROCESSING METHOD, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This non-provisional U.S. patent application is a continuation of U.S. patent application Ser. No. 17/476,132 filed on Sep. 15, 2021 and claims priority under 35 U.S.C. § 119 (a)-(d) to Japanese Patent Application No. 2020-158290, filed on Sep. 23, 2020, in the Japanese Patent Office, the entire contents of which are hereby incorporated by reference.

TECHNICAL FIELD

The present disclosure relates to a substrate processing apparatus, a method of manufacturing a semiconductor device and a substrate processing method.

BACKGROUND

As a part of a manufacturing process of a semiconductor device, a film-forming process of forming a film on a substrate accommodated in a process chamber of a substrate processing apparatus may be performed.

When the film-forming process serving as a part of the manufacturing process of the semiconductor device is performed, for example, using a process gas, the process gas supplied into a reaction vessel may cause deposits to adhere to an inside of the reaction vessel. Since the deposits in the process chamber may cause a generation of a substance such as particles, it is preferable to suppress an adhesion of the deposits to the inside of the reaction vessel.

SUMMARY

Described herein is a technique capable of suppressing an adhesion of deposits to an inside of a reaction vessel during a substrate processing using a substrate processing apparatus.

According to one aspect of the technique of the present disclosure, there is provided a substrate processing apparatus including: a reaction vessel configured to be capable of accommodating a substrate retainer provided with a substrate support region in which a substrate is supported and a heat insulator provided below the substrate support region; an auxiliary chamber provided in the reaction vessel and extending along an extending direction from at least a position below an upper end of the heat insulator to a position facing the substrate support region; and a first inner plate provided in the auxiliary chamber along a plane perpendicular to the extending direction of the auxiliary chamber so as to divide an inner space of the auxiliary chamber, wherein a first gap is provided between an outer periphery of the heat insulator and an edge of the first inner plate, a second gap is provided between the outer periphery of the heat insulator and at least a portion of an inner wall of the reaction vessel on which the auxiliary chamber is not provided, and the first gap and the second gap are substantially equal.

DETAILED DESCRIPTION

Embodiments

Figure 1:
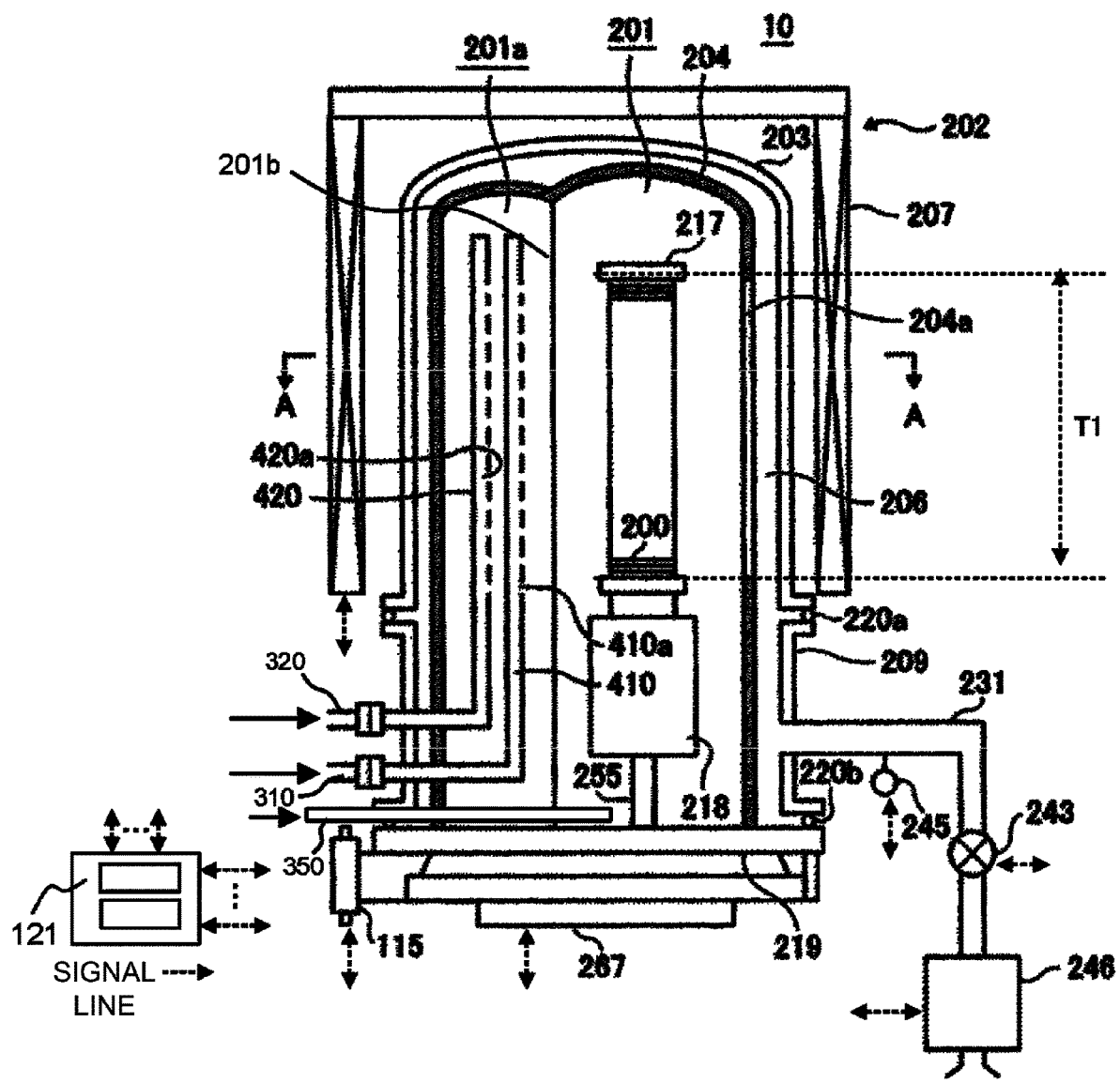
FIG. 1 is a diagram schematically illustrating a vertical cross-section of a vertical type process furnace of a substrate processing apparatus preferably used in one or more embodiments described herein.

Hereinafter, one or more embodiments (also simply referred to as "embodiments") according to the technique of the present disclosure will be described with reference to the drawings. First, a substrate processing apparatus 10 preferably used in the embodiments will be described with reference to FIGS. 1 through 8. In the following descriptions of the embodiments, like reference numerals represent like components in the drawings, and redundant descriptions related thereto will be omitted. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

As shown in FIG. 1, the substrate processing apparatus 10 according to the present embodiments includes a process furnace 202. The process furnace 202 is provided with a heater 207 serving as a heating apparatus (which is a heating structure or a heating system). The heater 207 is of a cylindrical shape, and is vertically installed while being supported by a heater base (not shown) serving as a support plate. The heater 207 also functions as an activator (also referred to as an "exciter") capable of activating (exciting) a gas such as a process gas by a heat.

A reaction tube constituting a reaction vessel (which is a process vessel) is provided in an inner side of the heater 207 to be aligned in a manner concentric with the heater 207. For example, the reaction tube is embodied by a double tube configuration including an inner tube (inner cylinder) 204 and an outer tube (outer cylinder) 203 provided to surround the inner tube 204 and to be aligned in a manner concentric with the inner tube 204. For example, each of the inner tube 204 and the outer tube 203 is made of a heat resistant material such as quartz (SiO2) and silicon carbide (SiC). For example, each of the inner tube 204 and the outer tube 203 is of a cylindrical shape with a closed upper end and an open lower end.

A process chamber 201 in which a plurality of wafers including a wafer 200 serving as a substrate are processed is provided in a hollow cylindrical portion of the inner tube 204 (that is, an inner region of the reaction vessel). Hereinafter, the plurality of wafers including the wafer 200 may also simply be referred to as wafers 200. The process chamber 201 is configured such that the wafers 200 can be accommodated in the process chamber 201 while being arranged in the process chamber 201 from an end (that is, a lower end) toward the other end (that is, an upper end) of the process chamber 201. An inner portion of the process chamber 201 may be divided into a plurality of regions. According to the present embodiment, a region in the process chamber 201 in which the wafers 200 are arranged in the process chamber 201 may also be referred to as a "substrate arrangement region" or a "wafer arrangement region". The wafer arrangement region may also be referred to as a "substrate processing region", a "wafer processing region", a "substrate support region" or a "wafer support region". The wafer arrangement region includes a region in which a temperature thereof is maintained uniform by the heater 207 (that is, a soaking region T1) in order to process the wafers 200 uniformly. In the process chamber 201, a region including the wafer arrangement region and surrounded by the heater 207, that is, a region whose temperature is relatively high may also be referred to as a "high temperature region". Further, in the process chamber 201, a region without including the wafer arrangement region and without being substantially surrounded by the heater 207 (a region around a heat insulator 218 described later), that is, a region whose temperature is relatively low may also be referred to as a "low temperature region". Specifically, the low temperature region is a region in the process chamber 201 below an upper surface of the heat insulator 218. In addition, a direction in which the wafers 200 are arranged in the process chamber 201 may also be referred to as a "substrate arrangement direction" or a "wafer arrangement direction".

A manifold (which is an inlet flange) 209 is provided under the outer tube 203 to be aligned in a manner concentric with the outer tube 203. Each of the inner tube 204 and the outer tube 203 is supported by the manifold 209 from thereunder. The manifold 209 is made of a metal such as stainless steel (SUS). The manifold 209 is of a cylindrical shape with open upper and lower ends. The lower end of the outer tube 203 is in contact with the upper end of the manifold 209. As shown in FIG. 1, an O-ring 220a serving as a seal is provided between the manifold 209 and the outer tube 203. As the manifold 209 is supported by the heater base (not shown), the outer tube 203 is installed vertically. The reaction vessel is constituted mainly by the outer tube 203, the inner tube 204 and the manifold 209.

An auxiliary chamber (which is a nozzle accommodating chamber) 201a is provided in the hollow cylindrical portion of the inner tube 204. The auxiliary chamber 201a is of a channel shape (a groove shape) protruding outward in a radial direction of the inner tube 204 from a side wall of the inner tube 204 and extending (stretching) along a vertical direction. An inner wall of the auxiliary chamber 201a constitutes a part of an inner wall of the process chamber 201. The auxiliary chamber 201a is provided so as to extend from at least a position below an upper end of the heat insulator 218 described later to a position facing the wafer arrangement region. The auxiliary chamber 201a may be provided so as to extend from the position below the upper end of the heat insulator 218 to a position corresponding to an upper end of the wafer arrangement region. The auxiliary chamber 201a may be provided so as to extend from a position corresponding to a lower end of the heat insulator 218 to the position corresponding to the upper end of the wafer arrangement region. The auxiliary chamber 201a may be provided so as to extend from a position corresponding to the lower end of the inner tube 204 to the position corresponding to the upper end of the wafer arrangement region. When viewed from above, it can be said that the auxiliary chamber 201a and the process chamber 201 communicate with each other through an opening 201b provided in the inner tube 204.

Figure 2:
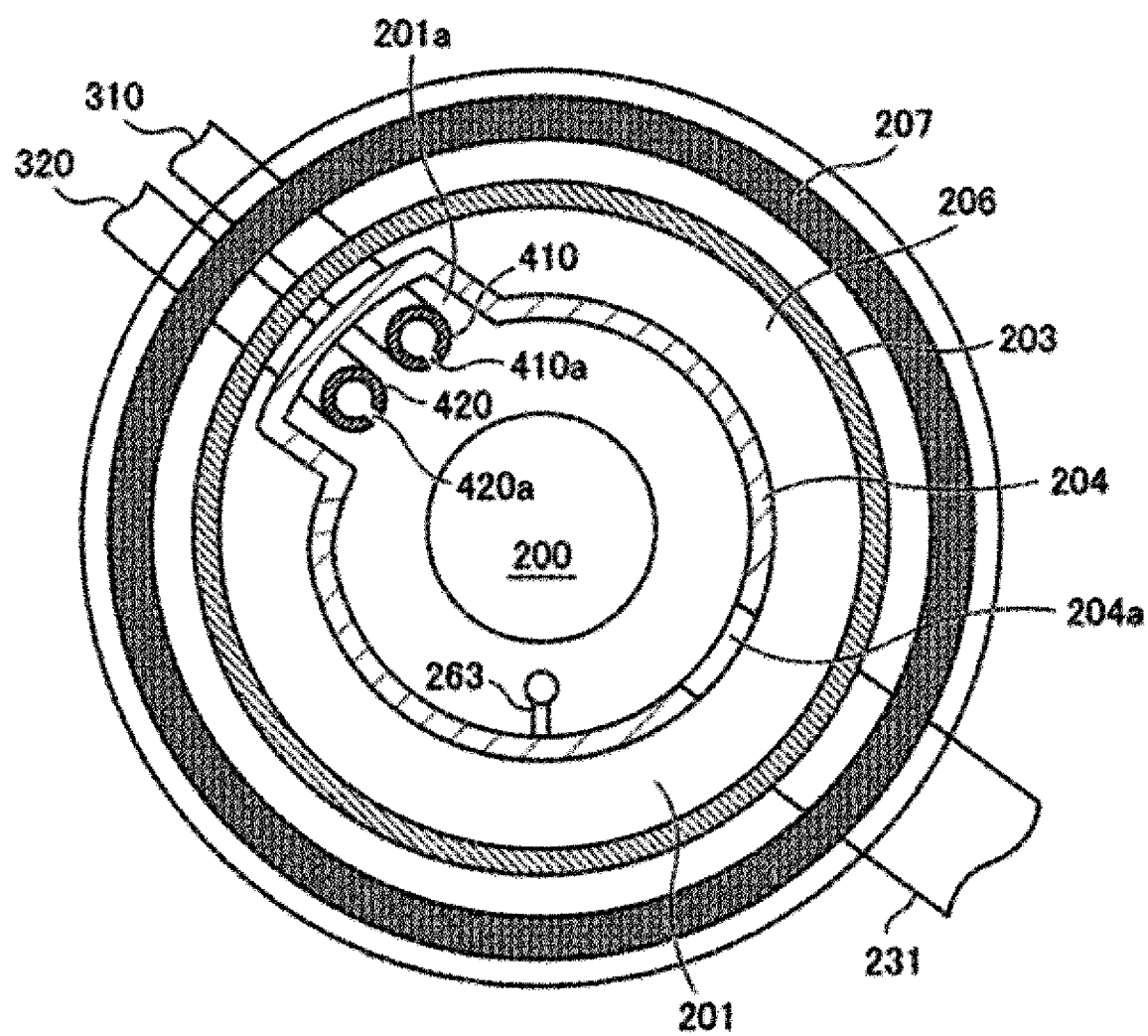
FIG. 2 is a diagram schematically illustrating a horizontal cross-section, taken along the line A-A shown in FIG. 1, of the vertical type process furnace of the substrate processing apparatus preferably used in the embodiments described herein.

Nozzles (also referred to as "gas supply nozzles") 410 and 420, which serve as a part of a gas supplier described later, are accommodated in the auxiliary chamber 201a. Each of the nozzles 410 and 420 is made of a heat resistant material such as quartz and silicon carbide. Each of the nozzles 410 and 420 may include an L-shaped long nozzle. Horizontal portions of the nozzles 410 and 420 are installed so as to penetrate a side wall of the manifold 209. Vertical portions of the nozzles 410 and 420 are installed in the auxiliary chamber 201a so as to extend upward from a lower portion toward an upper portion of the inner wall of the auxiliary chamber 201a along the wafer arrangement direction. That is, as shown in FIG. 2, the nozzles 410 and 420 are installed in a region that horizontally surrounds the wafer arrangement region on a peripheral area of the wafer arrangement region along the wafer arrangement region. As shown in FIG. 1, the nozzles 410 and 420 are provided such that upper ends of the nozzles 410 and 420 are located near a ceiling of a boat 217 described later. In the present disclosure, the nozzles 410 and 420 may also be referred to as a "first nozzle" and a "second nozzle", respectively.

A plurality of gas supply holes (which are openings) 410a and a plurality of gas supply holes (which are openings) 420a are provided at side surfaces of the nozzles 410 and 420, respectively. Gases such as a source gas and a reactive gas are supplied through the plurality of gas supply holes 410a and the plurality of gas supply holes 420a, respectively. The plurality of gas supply holes 410a and the plurality of gas supply holes 420a of the nozzles 410 and 420 are provided from upper portions to lower portions of the nozzles 410 and 420, respectively, along the wafer arrangement direction at positions facing the wafers 200, that is, corresponding to the entire area of the wafer arrangement region. That is, the plurality of gas supply holes 410a and the plurality of gas supply holes 420a are provided at positions from a lower portion to an upper portion of the boat 217 described later such that the gases can be ejected to each of the wafers 200 accommodated in the boat 217 through the plurality of gas supply holes 410*a* and the plurality of gas supply holes 420*a*, respectively.

The plurality of gas supply holes 410*a* and the plurality of gas supply holes 420*a* are open toward a center of the process chamber 201 such that the gases can be ejected toward the wafers 200.

According to the present embodiments, the gas such as the process gas is supplied through the nozzles 410 and 420 provided in the auxiliary chamber 201*a* which is a cylindrical space. Then, the gas is ejected into the process chamber 201 through the plurality of gas supply holes 410*a* and the plurality of gas supply holes 420*a* opened in the nozzles 410 and 420. The gas ejected into the inner tube 204 mainly flows parallel to surfaces of the wafers 200, that is, in a horizontal direction. Thereby, it is possible to uniformly supply the gas to each of the wafers 200. After passing the surfaces of the wafers 200, the gas flows toward an exhaust hole 204*a* described later. However, a flow direction of the gas may vary depending on a location of the exhaust hole 204*a*, and is not limited to the horizontal direction.

Gas supply pipes 310 and 320 are connected to the nozzles 410 and 420, respectively. As described above, the two nozzles 410 and 420 and the two gas supply pipes 310 and 320 are connected to the inner tube 204, and it is possible to supply various gases (for example, two types of gas, that is, the source gas and the reactive gas in the present embodiment) into the process chamber 201 through the two nozzles 410 and 420 and the two gas supply pipes 310 and 320.

A gas supply pipe 350 is connected to a lower portion of the manifold 209. The gas supply pipe 350 is provided so as to penetrate lower side walls of the manifold 209 and the inner tube 204.

Figure 3:
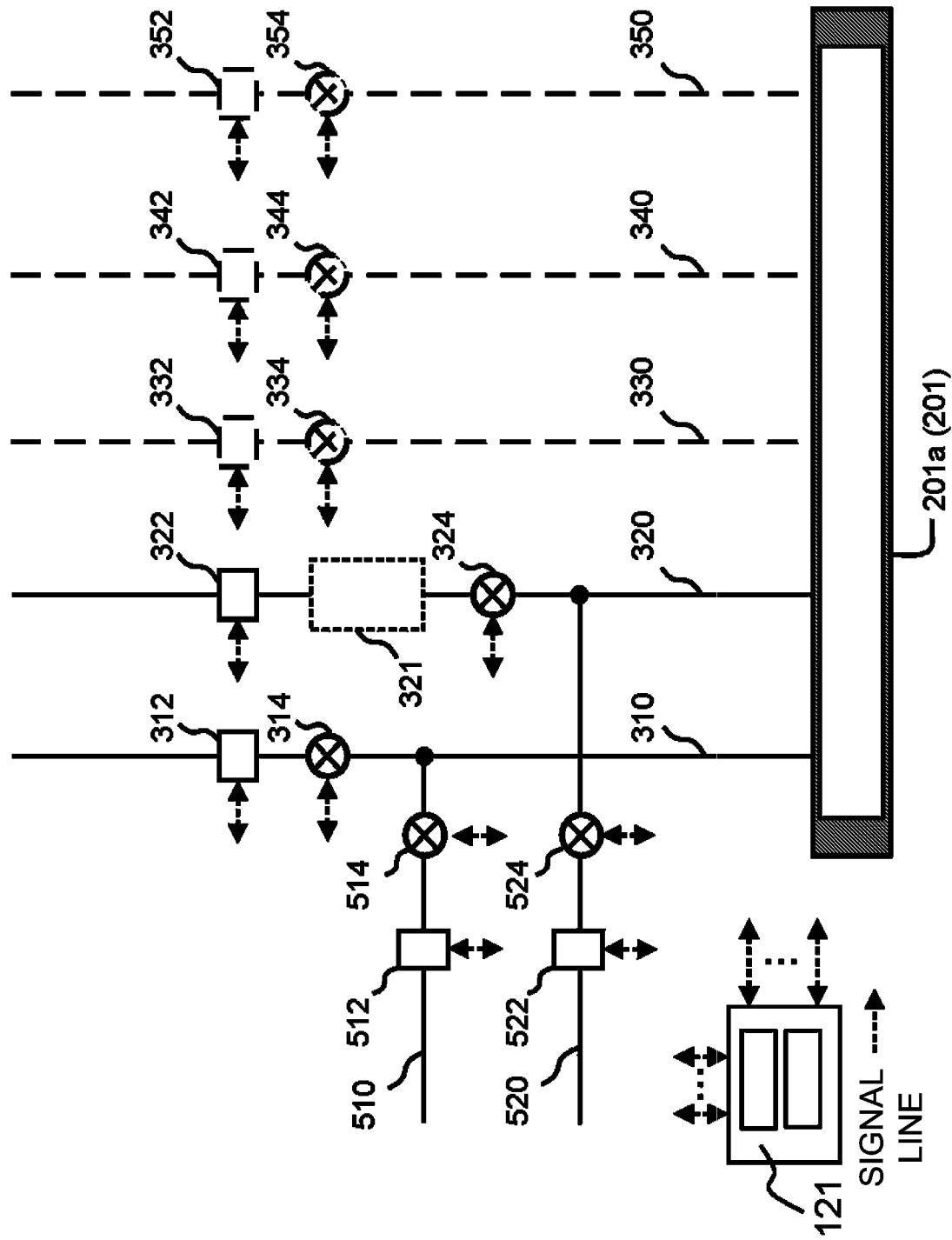
FIG. 3 is a diagram schematically illustrating a gas supplier of the substrate processing apparatus preferably used in the embodiments described herein.

As shown in FIG. 3, mass flow controllers (MFCs) 312, 322 and 352 serving as flow rate controllers (flow rate control structures) and valves 314, 324 and 354 serving as opening/closing valves are sequentially installed at the gas supply pipes 310, 320 and 350 in this order from upstream sides to downstream sides of the gas supply pipes 310, 320 and 350, respectively, in a gas flow direction. Gas supply pipes 510 and 520 through which an inert gas is supplied are connected to the gas supply pipes 310 and 320 at downstream sides of the valves 314 and 324, respectively. MFCs 512 and 522 serving as flow rate controllers (flow rate control structures) and valves 514 and 524 serving as opening/closing valves are sequentially installed at the gas supply pipes 510 and 520 in this order from upstream sides to downstream sides of the gas supply pipes 510 and 520, respectively, in the gas flow direction.

As the source gas serving as the process gas, a gas containing a predetermined element serving as a main element constituting a film formed on the wafer 200 (that is, a predetermined element-containing gas) can be supplied into the wafer processing region in the process chamber 201 through the gas supply pipe 310 provided with the MFC 312 and the valve 314 and the nozzle 410. In the present specification, the term "source gas" may refer to a source material in a gaseous state such as a gas obtained by vaporizing the source material in a liquid state under the normal temperature and the normal pressure and a source material in a gaseous state under the normal temperature and the normal pressure. The predetermined element-containing gas acts as a film-forming gas, that is, a predetermined element source material.

The reactive gas (reactant) serving as the process gas can be supplied into the wafer processing region in the process chamber 201 through the gas supply pipe 320 provided with the MFC 322 and the valve 324 and the nozzle 420. For example, an oxidizing gas or a nitriding gas may be used as the reactive gas. The reactive gas acts as the film-forming gas.

The inert gas can be supplied into the wafer processing region in the process chamber 201 through the gas supply pipes 510 and 520 provided with the MFCs 512 and 522 and the valves 514 and 524, respectively, and the nozzles 410 and 420. The inert gas acts as a purge gas, a dilution gas or a carrier gas.

The inert gas can be supplied into the low temperature region in the process chamber 201 through the gas supply pipe 350 provided with the MFC 352 and the valve 354. The inert gas acts as the purge gas. The gas supply pipe 350 may be connected to a rotator 267 described later to supply the inert gas from an outer circumference of a rotating shaft 255 to the low temperature region in the process chamber 201.

A source gas supplier (which is a source gas supply structure, a source gas supply system or a metal-containing source gas supplier) is constituted mainly by the gas supply pipe 310, the MFC 312 and the valve 314. The source gas supplier may further include the nozzle 410. A reactive gas supplier (which is a reactive gas supply structure, a reactive gas supply system or an oxygen-containing gas supplier) is constituted mainly by the gas supply pipe 320, the MFC 322 and the valve 324. The reactive gas supplier may further include the nozzle 420. The source gas supplier and the reactive gas supplier may be collectively referred to as a process gas supply supplier (which is a process gas supply structure, a process gas supply system, a gas supplier, a gas supply structure or a gas supply system). Further, at least one among the source gas supplier and the reactive gas supplier may be referred to as the process gas supplier. A first inert gas supplier (which is a first inert gas supply structure, a first inert gas supply system, a purge gas supplier, a dilution gas supplier or a carrier gas supplier) is constituted mainly by the gas supply pipes 510 and 520, the MFCs 512 and 522 and the valves 514 and 524. A second inert gas supplier (which is a second inert gas supply structure, a second inert gas supply system or a purge gas supplier), is constituted mainly by the gas supply pipe 350, the MFC 352 and the valve 354.

As shown in FIG. 1, the exhaust hole (exhaust slit) 204*a* is provided on the side wall of the inner tube 204. For example, the exhaust hole 204*a* may be of a narrow slit-shaped through-hole elongating vertically. For example, the exhaust hole 204*a* is of a rectangular shape when viewed from front. The exhaust hole 204*a* is provided so as to cover the entirety of the wafer arrangement region along the wafer arrangement direction from a lower portion to an upper portion of the side wall of the inner tube 204. The exhaust hole 204*a* is not limited to the slit-shaped through-hole. For example, the exhaust hole 204*a* may be configured as a plurality of holes. An inside of the process chamber 201 and an exhaust path 206 defined by an annular space (gap) between the inner tube 204 and the outer tube 203 are in communication with each other through the exhaust hole 204*a*.

As shown in FIG. 2, when viewed from above, the auxiliary chamber 201*a* and the exhaust hole 204*a* are provided so as to face each other with a center of the wafer 200 accommodated in the process chamber 201 interposed therebetween (that is, the exhaust hole 204*a* is provided at a location opposite to the auxiliary chamber 201*a* by 180°).

Further, the nozzles 410 and 420 and the exhaust hole 204a are provided so as to face each other with the center of the wafer 200 accommodated in the process chamber 201 interposed therebetween.

As shown in FIG. 1, an exhaust pipe 231 through which an inner atmosphere of the process chamber 201 is exhausted is installed at the manifold 209 through the exhaust path 206. A vacuum pump 246 serving as a vacuum exhaust apparatus is connected to the exhaust pipe 231 through a pressure sensor 245 serving as a pressure detector (pressure detecting structure) configured to detect an inner pressure of the exhaust path 206 (that is, an inner pressure of the process chamber 201) and an APC (Automatic Pressure Controller) valve 243 serving as a pressure regulator (which is a pressure adjusting structure). With the vacuum pump 246 in operation, the APC valve 243 may be opened or closed to perform a vacuum exhaust of the process chamber 201 or stop the vacuum exhaust. With the vacuum pump 246 in operation, an opening degree of the APC valve 243 may be adjusted in order to adjust the inner pressure of the process chamber 201 based on pressure information detected by the pressure sensor 245. An exhauster (which is an exhaust system), that is, an exhaust line is constituted mainly by the exhaust pipe 231, the APC valve 243 and the pressure sensor 245. The exhauster may further include the exhaust hole 204a, the exhaust path 206 and the vacuum pump 246.

A lower end opening of the manifold 209 is configured as a furnace opening of the process furnace 202. When the boat 217 is elevated by a boat elevator 115 described later, the lower end opening of the manifold 209 is airtightly (hermetically) sealed by a seal cap 219 serving as a lid through an O-ring 220b. The seal cap 219 is made of a metal such as SUS, and is of a disk shape. The rotator 267 configured to rotate the boat 217 is provided below the seal cap 219. The rotating shaft 255 of the rotator 267 is connected to the boat 217 through the seal cap 219. As the rotator 267 rotates the boat 217, the wafers 200 accommodated in the boat 217 are rotated. The seal cap 219 may be elevated or lowered in the vertical direction by the boat elevator 115 serving as an elevator vertically provided outside the outer tube 203. When the seal cap 219 is elevated or lowered in the vertical direction by the boat elevator 115, the substrates 200 accommodated in the boat 217 may be transferred (loaded) into the process chamber 201 or transferred (unloaded) out of the process chamber 201. The boat elevator 115 serves as a transfer device (which is a transfer structure) that loads the boat 217 and the wafers 200 supported by the boat 217 into the process chamber 201 or unloads the boat 217 and the wafers 200 supported by the boat 217 out of the process chamber 201.

Figure 4:
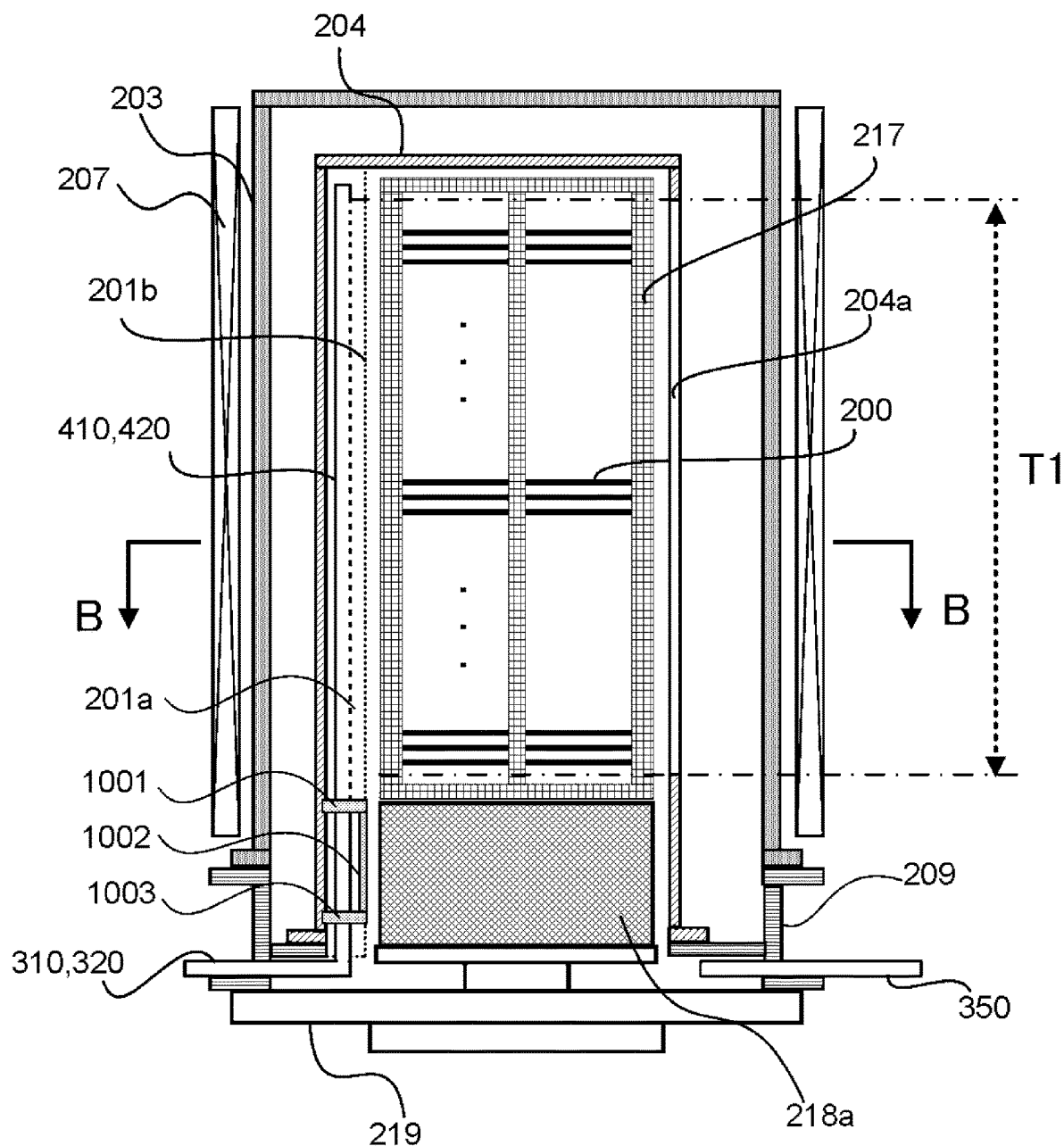
FIG. 4 is an enlarged view schematically illustrating a vertical cross-section of the vertical type process furnace of the substrate processing apparatus preferably used in the embodiments described herein and specifically describing a periphery of a heat insulator.

The boat 217 serving as a substrate retainer includes the wafer arrangement region (substrate support region). In the wafer arrangement region, the wafers 200 (for example, 25 to 200 wafers) are accommodated (or supported) in the vertical direction while the wafers 200 are horizontally oriented with their centers aligned with one another with a predetermined interval therebetween in a multistage manner. Further, the boat 217 includes a heat insulator support region in which the heat insulator 218 is accommodated (or supported). The heat insulator support region is provided below the wafer arrangement region. As the wafer 200, a wafer such as a product wafer, a dummy wafer and a fill dummy wafer is supported in the wafer arrangement region of the boat 217. For example, the boat 217 is made of a heat resistant material such as quartz and SiC. As shown in FIG. 4, in the heat insulator support region of the boat 217, a heat insulating cylinder 218a serving as the heat insulator 218 is provided. For example, the heat insulating cylinder 218a is made of a heat resistant material such as quartz and SiC, and is of a cylindrical shape. With such a configuration, the heat insulating cylinder 218a suppresses the transmission of the heat from the heater 207 to the seal cap 219. A space may be provided in the heat insulating cylinder 218a, and a heater (not shown) may be provided in the space of the heat insulating cylinder 218a. In such a case, the heat insulating cylinder 218a may also be referred to as a "heat retaining cylinder".

When the process gas such as the source gas and the reactive gas flows into a region below an upper end of the heat insulator 218 such as an outer peripheral surface of the heat insulator 218, the inner wall of the auxiliary chamber 201a and a lower region of the heat insulator 218, deposits due to the source gas or the reactive gas may adhere to a structure provided in the region below the upper end of the heat insulator 218. As will be described later, even when a cleaning process is performed, it may be difficult to remove the deposits. Since a substance such as particles may be generated due to the deposits left unremoved, it is preferable to suppress a flow of the process gas into the region below the upper end of the heat insulator 218. However, when a protruding space such as the auxiliary chamber 201a is provided in the inner tube 204, the process gas may flow into the region below the upper end of the heat insulator 218 through a space of the auxiliary chamber 201a.

First Cover 1001

Figure 5:
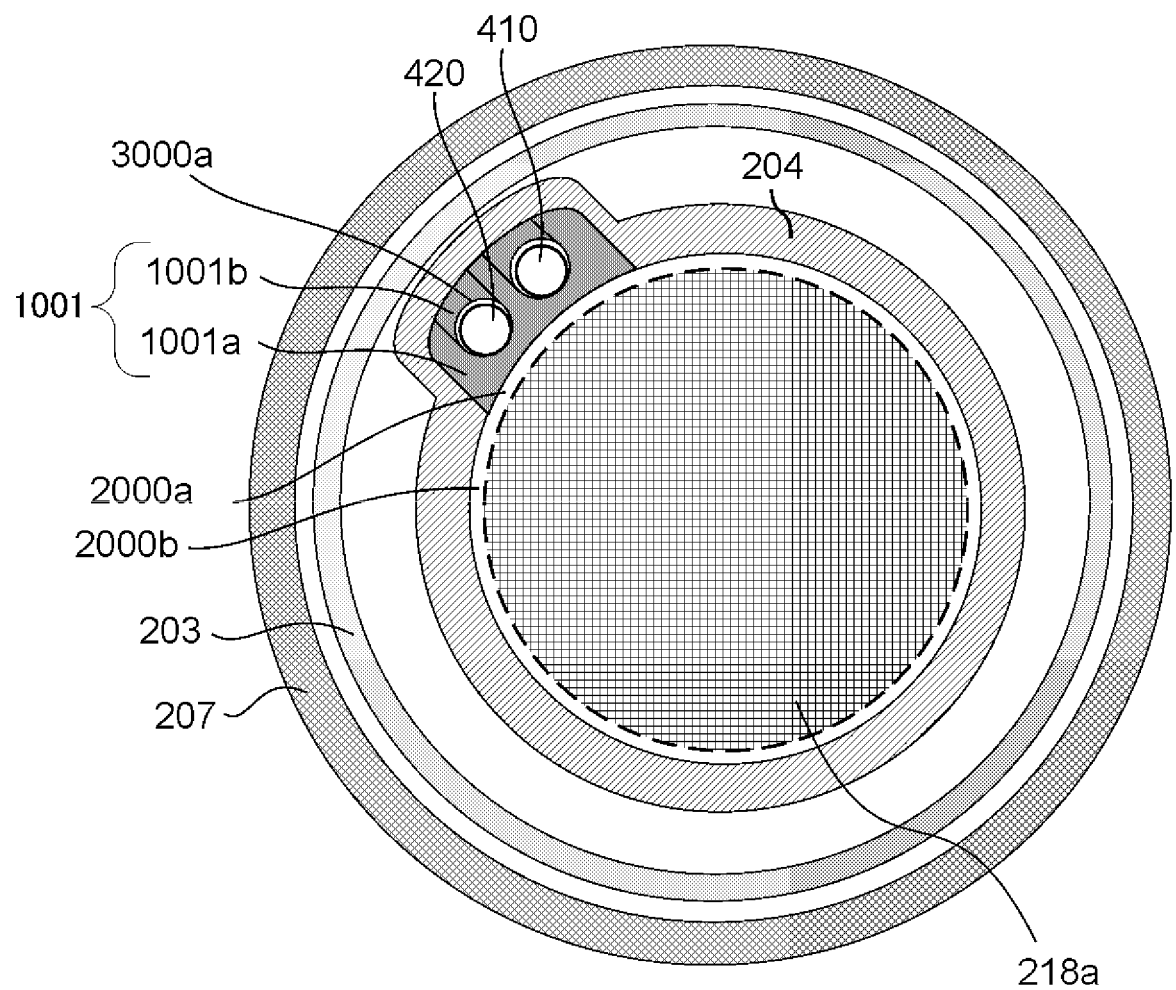
FIG. 5 is a diagram schematically illustrating a horizontal cross-section, taken along the line B-B shown in FIG. 4, of the vertical type process furnace of the substrate processing apparatus preferably used in the embodiments described herein and specifically describing the periphery of the heat insulator.
Figure 6:
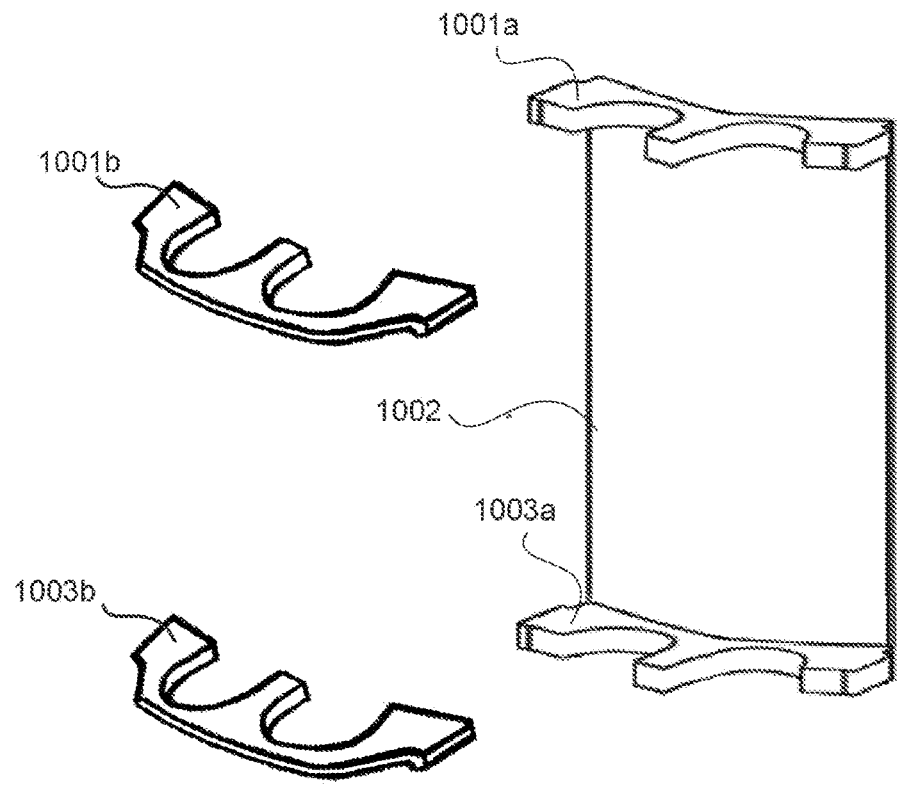
FIG. 6 is a diagram schematically illustrating a first cover, a second cover and a third cover provided in the substrate processing apparatus preferably used in the embodiments described herein.
Figure 7:
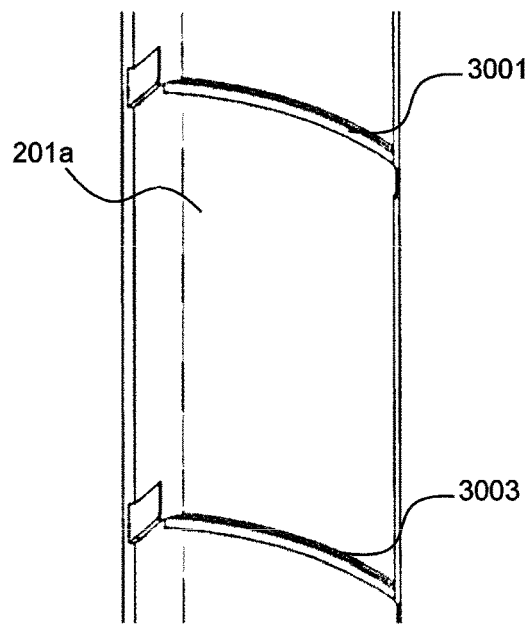
FIG. 7 is a diagram schematically illustrating an inner wall of an auxiliary chamber provided in the substrate processing apparatus preferably used in the embodiments described herein.

According to the present embodiments, as shown in FIGS. 4 through 6, a first cover 1001 is provided in the auxiliary chamber 201a and extends along a plane perpendicular to an extending direction of the auxiliary chamber 201a so as to divide an inner space of the auxiliary chamber 201a into two spaces above and below the first cover 1001. When viewed from above, the first cover 1001 is of a plate shape, and is provided such that an edge of the first cover 1001 is elongated along and in contact with the inner wall of the auxiliary chamber 201a so as to cover the auxiliary chamber 201a. Further, the first cover 1001 is provided with an opening penetrated by the nozzles 410 and 420 provided in the auxiliary chamber 201a. However, the first cover 1001 is not limited thereto. For example, the first cover 1001 may be of a block shape whose thickness is large in the vertical direction. Similar to the inner tube 204, for example, the first cover 1001 is made of a heat resistant material such as quartz and silicon carbide. However, the first cover 1001 and the inner tube 204 may be made of different materials. The same also applies to materials constituting a second cover 1002 and a third cover 1003, which will be described later.

The first cover 1001 limits a flow of the gas between the two spaces in the space chamber 201a divided by the first cover 1001. By providing the first cover 1001, it is possible to prevent (or suppress) the process gas supplied to the wafer arrangement region (that is, a space above the heat insulator 218) from flowing into the region below the upper end of the heat insulator 218 through the space in the auxiliary chamber 201a.

The first cover 1001 is provided so that an upper surface of the first cover 1001 is located at the same height as the upper end of the heat insulator 218. That is, the upper surface of the heat insulator 218 and the upper surface of the first cover 1001 are located at the same plane. As a result, it is possible to suppress a stagnation of the process gas that may occur at a stepped portion between the upper surface of the heat insulator 218 and the upper surface of the first cover 1001. In addition, even when the second cover 1002 described later is not provided, it is possible to limit a flow path through which the process gas flows into the region below the upper end of the heat insulator 218 to a gap (a first gap 2000a described later) between an outer edge of the upper end of the heat insulator 218 and the edge of the first cover 1001.

The first cover 1001 may be provided such that the upper surface of the first cover 1001 is located above the upper end of the heat insulator 218. In such a case, the first cover 1001 is provided below a lower end of a height range in which the plurality of gas supply holes 410a of the nozzle 410 and the plurality of gas supply holes 420a of the nozzle 420 are provided. In particular, when the low temperature region (outside the soaking region T1) is provided above the heat insulator 218, it is preferable to provide the first cover 1001 such that a flow rate of the process gas supplied to the inner wall of the auxiliary chamber 201a in the low temperature region is limited so as to suppress an adhesion of the film in the low temperature region.

The first cover 1001 may be provided such that the upper surface of the first cover 1001 is located above a lower end of the soaking region T1. More specifically, for example, the first cover 1001 may be provided such that the upper surface of the first cover 1001 is located above a lower end of the heater 207 configured to heat the wafer arrangement region. As a result, it is possible to suppress the flow of the process gas into the low temperature region where it is difficult to remove the deposits by a gas cleaning process.

In addition, in order to prevent the process gas from being supplied above the outer peripheral surface of the heat insulator 218 and to prevent the deposits from adhering to the heat insulator 218, it is preferable that the first cover 1001 is provided not below the upper end of the heat insulator 218 but at the same height as the upper end of the heat insulator 218 or above the upper end of the heat insulator 218. When the first cover 1001 is provided above the upper end of the heat insulator 218, it is more preferable to provide the second cover 1002 described later so as to limit the flow path through which the process gas flows into the region below the upper end of the heat insulator 218 to the first gap 2000a described later.

The inert gas supplied through the gas supply pipe 350 to a space below the heat insulator 218 serves as the purge gas so as to prevent the process gas supplied to the wafer arrangement region (the space above the heat insulator 218) from entering (or flowing into) a space below the upper end of the heat insulator 218.

More specifically, the first gap 2000a is provided between an edge of a first inner plate 1001a and an outer edge of the heat insulator 218, and is elongated along those edges. In addition, a second gap 2000b is provided between an inner wall of the inner tube 204 in which the auxiliary chamber 201a is not provided and the outer edge of the heat insulator 218, and is elongated along the outer edge of the heat insulator 218. Each of the first gap 2000a and the second gap 2000b constitutes a gas flow path configured to limit the ease of gas flow (that is, a conductance) between the space below the heat insulator 218 and the wafer arrangement region. By providing the flow path configured to limit the ease of gas flow as described above, it is possible to prevent (or suppress) the process gas supplied to the wafer arrangement region from entering a space below the first cover 1001 (the space below the upper end of the heat insulator 218). In addition, since an inner pressure of the space below the heat insulator 218 to which the inert gas is supplied can be made higher than an inner pressure of the wafer arrangement region decompressed by the exhauster, it is possible to more reliably suppress the flow of the process gas into the space below the first cover 1001 by ejecting the inert gas through the first gap 2000a and the second gap 2000b into the wafer arrangement region.

In order to further improve an effect of suppressing the flow of the process gas into the space below the first cover 1001, the heat insulator 218, the inner tube 204 and the auxiliary chamber 201a are provided such that a width of each of the first gap 2000a and the second gap 2000b is constant along a circumferential direction. Although the widths of the first gap 2000a and the second gap 2000b may be different, it is preferable that the widths of the first gap 2000a and the second gap 2000b are substantially the same. Thereby, it is possible to circulate the inert gas through the first gap 2000a and the second gap 2000b at an equal flow rate. As a result, it is possible to suppress an adhesion of the deposits evenly over the entirety of the outer peripheral surface of the heat insulator 218. For example, the widths of the first gap 2000a and the second gap 2000b may be set to a predetermined width ranging from 3 mm to 30 mm. When the predetermined width is less than 3 mm, there is a high possibility that the heat insulating cylinder 218a and the inner tube 204 come into contact with each other when the boat 217 rotates. When the predetermined width is greater than 30 mm, it may be difficult to suppress the flow of the process gas into the space below the first cover 1001.

Second Cover 1002

The second cover 1002 is provided below the first cover 1001 along the extending direction of the auxiliary chamber 201a. The second cover 1002 extends downward from the edge of the first cover 1001 facing the heat insulator 218 so as to cover an opening (that is, the opening 201b) of the auxiliary chamber 201a. That is, the second cover 1002 is provided between the outer peripheral surface of the heat insulator 218 and the auxiliary chamber 201a. Thereby, an inert gas flow path through which the inert gas supplied to the lower region of the heat insulator 218 flows toward the wafer arrangement region is provided between the outer peripheral surface of the heat insulator 218 and the second cover 1002. As a result, it is possible to more reliably prevent (or suppress) the process gas from being supplied to the outer peripheral surface of the heat insulator 218 facing the auxiliary chamber 201a and to prevent (or suppress) the deposits from adhering to the outer peripheral surface of the heat insulator 218.

The second cover 1002 may be constituted by a plate with a curved surface facing the outer peripheral surface of the heat insulator 218 and constituting the same circumference as the inner wall of the inner tube 204 when viewed from above. That is, the first gap 2000a is provided not only at the upper end of the heat insulator 218 but also downward from the upper end of the heat insulator 218.

A lower end of the second cover 1002 is provided so as to extend to a position corresponding to a lower end of the auxiliary chamber 201a. The lower end of the second cover 1002 may be provided so as to extend to a position corresponding to the lower end of the heat insulator 218. Further, the lower end of the second cover 1002 may be provided so as to extend to a position corresponding to an upper surface of the seal cap 219. However, in order to fix the third cover 1003 by a third fixing groove 3003 described later, it is preferable that the lower end of the second cover 1002 is located at the position corresponding to the lower end of the auxiliary chamber 201a or a position above the lower end of the auxiliary chamber 201a (however, a position lower than the first cover 1001). On the other hand, from a viewpoint of suppressing the adhesion of the deposits to the outer peripheral surface of the heat insulator 218, it is preferable that the lower end of the second cover 1002 is located as lower as possible, and extends to the position corresponding to the lower end of the heat insulator 218.

Third Cover 1003

The third cover 1003 is further provided at a position corresponding to the lower end of the second cover 1002 inside the auxiliary chamber 201a along the plane perpendicular to the extending direction of the auxiliary chamber 201a. That is, similar to the first cover 1001, when viewed from above, the third cover 1003 is of a plate shape (or a block shape), and an edge of the third cover 1003 is elongated along and in contact with the inner wall of the auxiliary chamber 201a so as to cover the auxiliary chamber 201a (in other words, so as to cover a cross-section of the auxiliary chamber 201a in a plane perpendicular to the extending direction of the auxiliary chamber 201a). Further, the third cover 1003 is provided with an opening through which the nozzles 410 and 420 provided in the auxiliary chamber 201a penetrate.

The third cover 1003 limits a flow of the inert gas mainly supplied through the gas supply pipe 350 into a space in the auxiliary chamber 201a constituted by the first cover 1001, the second cover 1002 and the third cover 1003. By limiting the flow of the inert gas supplied below the heat insulator 218 into the auxiliary chamber 201a, it is possible to form a flow of the inert gas such that the inert gas flows smoothly in the inert gas flow path between the second cover 1002 and the heat insulator 218.

Divided Structure of First Cover 1001

As shown in FIG. 6, the first cover 1001 is constituted by the first inner plate 1001a and a first outer plate 1001b. The edge of the first inner plate 1001a facing the heat insulator 218 is provided along the outer edge of the heat insulator 218, and the first inner plate 1001a is provided with a notch so as to surround the nozzles 410 and 420. An edge of the first outer plate 1001b is elongated along and in contact with the inner wall of the auxiliary chamber 201a, and the first outer plate 1001b is provided with a notch so as to surround the nozzles 410 and 420. The first inner plate 1001a and the first outer plate 1001b are arranged such that at least a part of them overlap each other when viewed from above.

Divided Structure of Third Cover 1003

Similar to the first cover 1001, the third cover 1003 is constituted by a third inner plate 1003a and a third outer peripheral plate 1003b. An edge of the third inner plate 1003a facing the heat insulator 218 is provided along the outer edge of the heat insulator 218, and the third inner plate 1003a is provided with a notch so as to surround the nozzles 410 and 420. An edge of the third outer plate 1003b is elongated along and in contact with the inner wall of the auxiliary chamber 201a, and the third outer plate 1003b is provided with a notch so as to surround the nozzles 410 and 420. The third inner plate 1003a and the third outer plate 1003b are arranged such that at least a part of them overlap each other when viewed from above.

By providing the first cover 1001 and the third cover 1003 by dividing them as described above, respectively, even when a structure such as the nozzles 410 and 420 is provided in the auxiliary chamber 201a so as to extend in the vertical direction, it is possible to easily install the first cover 1001 and the third cover 1003 so as to cover a horizontal cross-section of the auxiliary chamber 201a without providing a gap between the inner wall of the auxiliary chamber 201a and the first cover 1001 and a gap between the inner wall of the auxiliary chamber 201a and the third cover 1003 or minimizing the gaps described above even when the gaps are provided.

Fixing Structure of First Cover 1001 and Third Cover 1003

A first fixing groove 3001 and the third fixing groove 3003, which are grooves (stepped portions) provided on the inner wall of the auxiliary chamber 201a in a direction perpendicular to the extending direction of the auxiliary chamber 201a, are elongated along the inner wall of the auxiliary chamber 201a. The first fixing groove 3001 and the third fixing groove 3003 are provided to engage with the first cover 1001 and the third cover 1003, respectively, to fix the first cover 1001 and the third cover 1003 to the inner wall of the auxiliary chamber 201a, respectively. By engaging and fixing the first cover 1001 and the third cover 1003 to the first fixing groove 3001 and the third fixing groove 3003, respectively, it is possible to install the first cover 1001 and the third cover 1003 without leaving a gap between the inner wall of the auxiliary chamber 201a and the first cover 1001 or between the inner wall of the auxiliary chamber 201a and the third cover 1003. Specifically, first, the first outer plate 1001b and the third outer plate 1003b are installed so as to engage with the first fixing groove 3001 and the third fixing groove 3003, respectively. Subsequently, the nozzles 410 and 420 are installed so as to match the notches of the first outer plate 1001b and the third outer plate 1003b, respectively. Subsequently, the first inner plate 1001a and the third inner plate 1003a are installed so as to overlap the first outer plate 1001b and the third outer plate 1003b, respectively, and to engage with the grooves (that is, the first fixing groove 3001 and the third fixing groove 3003) provided on the inner wall of the auxiliary chamber 201a.

A first cover opening 3000a may be provided between the first cover 1001 and the nozzles 410 and 420. The first cover opening 3000a functions as an outlet through which the inert gas supplied into the auxiliary chamber 201a below the first cover 1001 is ejected into the wafer arrangement region. As a result, it is possible to prevent the process gas from entering the auxiliary chamber 201a below the first cover 1001.

In such a case, an area of the first cover opening 3000a is set such that an inner pressure of the auxiliary chamber 201a below the first cover 1001 is greater than the inner pressure of the wafer arrangement region. When the area of the first cover opening 3000a is too large, the process gas in the wafer arrangement region may enter the auxiliary chamber 201a below the first cover 1001. Therefore, for example, a width of the first cover opening 3000a is preferably set 5 mm or less.

In such a case, a flow rate of the inert gas supplied through the gas supply pipe 350 is controlled such that the inner pressure of the auxiliary chamber 201a below the first cover 1001 is greater than the inner pressure of the wafer arrangement region.

In addition, in order to set the inner pressure of the auxiliary chamber 201a below the first cover 1001 greater than the inner pressure of the wafer arrangement region, it is preferable to provide a third cover opening (not shown) serving as an inert gas flow path between the third cover 1003 and the nozzles 410 and 420. The area of the first cover opening 3000a is smaller than an area of the third cover opening. As a result, it is possible to set the inner pressure of the auxiliary chamber 201a below the first cover 1001 greater than the inner pressure of the wafer arrangement region.

As shown in FIG. 6, the first inner plate 1001a, the second cover 1002 and the third inner plate 1003a are integrally formed as a single body. The first cover 1001, the second cover 1002 and the third cover 1003 may be integrally formed as a single body, or each of the first cover 1001, the second cover 1002 and the third cover 1003 may be formed as a separable component.

Figure 11:
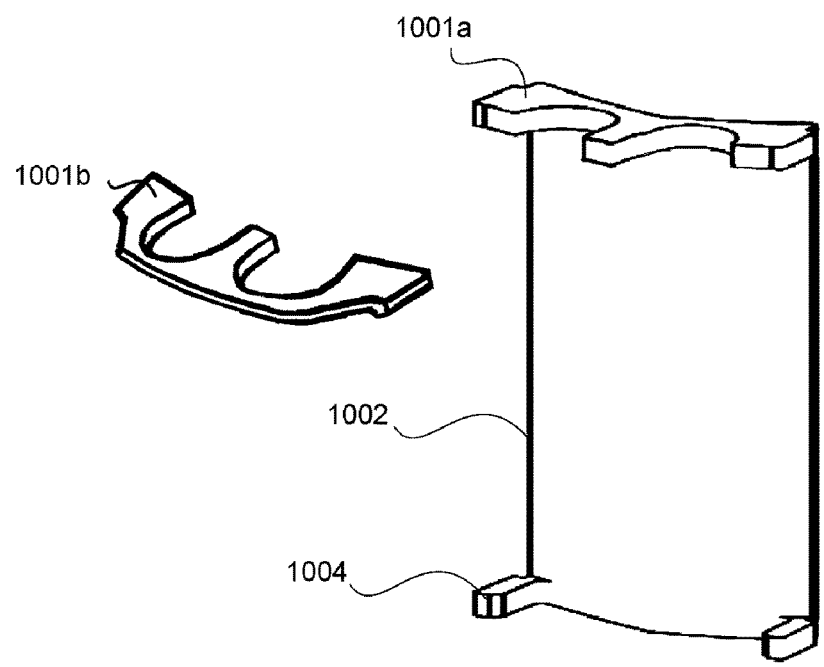
FIG. 11 is a diagram schematically illustrating a first cover and a second cover provided in the substrate processing apparatus preferably used in a modified example of the embodiments described herein.

In the embodiments described above, an auxiliary chamber cover is constituted by the first cover 1001, the second cover 1002 and the third cover 1003. However, as in a modified example shown in FIG. 11, the auxiliary chamber cover may not include the third cover 1003, and a protrusion 1004 configured to fix the second cover 1002 to the third fixing groove 3003 is provided at the lower end of the second cover 1002. By engaging the protrusion 1004 with the third fixing groove 3003, it is possible to fix the second cover 1002 to the inner wall of the auxiliary chamber 201*a*.

As shown in FIG. 2, a temperature sensor 263 serving as a temperature detector is installed in the inner tube 204. An amount of the current supplied to the heater 207 is adjusted based on temperature information detected by the temperature sensor 263 such that a desired temperature distribution of an inner temperature of the process chamber 201 can be obtained. Similar to the nozzles 410 and 420, the temperature sensor 263 is L-shaped, and is provided along the inner wall of the inner tube 204. A second auxiliary chamber (not shown) similar to the auxiliary chamber 201*a* accommodating the nozzles 410 and 420 may be provided. The second auxiliary chamber is of a channel shape (a groove shape) protruding outward in the radial direction of the inner tube 204 from the side wall of the inner tube 204 and extending (stretching) along the vertical direction. The temperature sensor 263 may be accommodated in the second auxiliary chamber. In such a case, similar to the auxiliary chamber 201*a*, in order to prevent (or suppress) the process gas from flowing into the region below the upper end of the heat insulator 218 through the second auxiliary chamber, the same configuration as the first cover 1001, the second cover 1002 and the third cover 1003 may be provided in the second auxiliary chamber.

Figure 8:
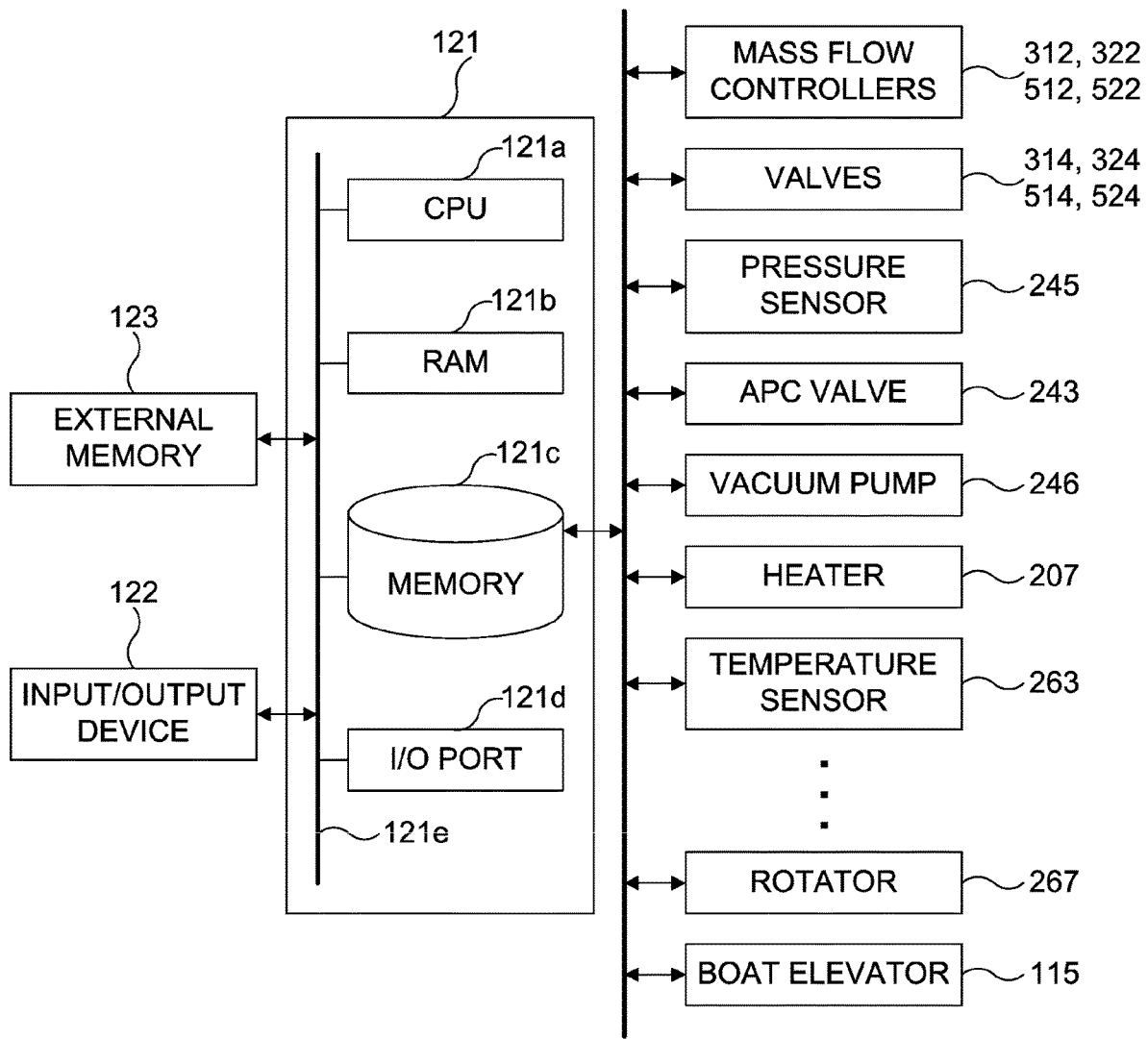
FIG. 8 is a block diagram schematically illustrating a configuration of a controller and related components of the substrate processing apparatus preferably used in the embodiments described herein.

As shown in FIG. 8, a controller 121 serving as a control device (control structure) is constituted by a computer including a CPU (Central Processing Unit) 121*a*, a RAM (Random Access Memory) 121*b*, a memory 121*c* and an I/O port 121*d*. The RAM 121*b*, the memory 121*c* and the I/O port 121*d* may exchange data with the CPU 121*a* through an internal bus 121*e*. For example, an input/output device 122 such as a touch panel is connected to the controller 121.

The memory 121*c* is configured by a component such as a flash memory, a hard disk drive (HDD) and a solid state drive (SDD). For example, a control program configured to control the operation of the substrate processing apparatus 10 or a process recipe containing information on the sequences and conditions of a method of manufacturing a semiconductor device described later is readably stored in the memory 121*c*. The process recipe is obtained by combining steps (sequences or processes) of the method of manufacturing the semiconductor device described later such that the controller 121 can execute the steps to acquire a predetermined result, and functions as a program. Hereafter, the process recipe and the control program may be collectively or individually referred to as a "program". In addition, the process recipe may also be simply referred to as a "recipe". In the present specification, the term "program" may refer to the recipe alone, may refer to the control program alone, or may refer to both of the recipe and the control program. The RAM 121*b* functions as a memory area (work area) where a program or data read by the CPU 121*a* is temporarily stored.

The I/O port 121*d* is connected to the above-described components such as the MFCs 312, 322, 352, 512 and 522, the valves 314, 324, 354, 514 and 524, the pressure sensor 245, the APC valve 243, the vacuum pump 246, the heater 207, the temperature sensor 263, the rotator 267 and the boat elevator 115.

The CPU 121*a* is configured to read the control program from the memory 121*c* and execute the read control program. In addition, the CPU 121*a* is configured to read the recipe from the memory 121*c* in accordance with an operation command inputted from the input/output device 122. According to the contents of the read recipe, the CPU 121*a* may be configured to be capable of controlling various operations such as flow rate adjusting operations for various gases by the MFCs 312, 322, 352, 512 and 522, opening and closing operations of the valves 314, 324, 354, 514 and 524, an opening and closing operation of the APC valve 243, a pressure adjusting operation by the APC valve 243 based on the pressure sensor 245, a temperature adjusting operation by the heater 207 based on the temperature sensor 263, a start and stop of the vacuum pump 246, an operation of adjusting the rotation and the rotation speed of the boat 217 by the rotator 267, an elevating and lowering operation of the boat 217 by the boat elevator 115 and an operation of transferring and accommodating the wafer 200 into the boat 217.

The controller 121 may be embodied by installing the above-described program stored in an external memory 123 into a computer. For example, the external memory 123 may include a magnetic disk such as a hard disk drive (HDD), an optical disk such as a CD, a magneto-optical disk such as an MO and a semiconductor memory such as a USB memory. The memory 121*c* or the external memory 123 may be embodied by a non-transitory computer readable recording medium. Hereafter, the memory 121*c* and the external memory 123 may be collectively or individually referred to as a recording medium. In the present specification, the term "recording medium" may refer to the memory 121*c* alone, may refer to the external memory 123 alone, and may refer to both of the memory 121*c* and the external memory 123. Instead of the external memory 123, a communication means such as the Internet and a dedicated line may be used for providing the program to the computer.

(2) Substrate Processing (Manufacturing Process of Semiconductor Device)

Figure 9:
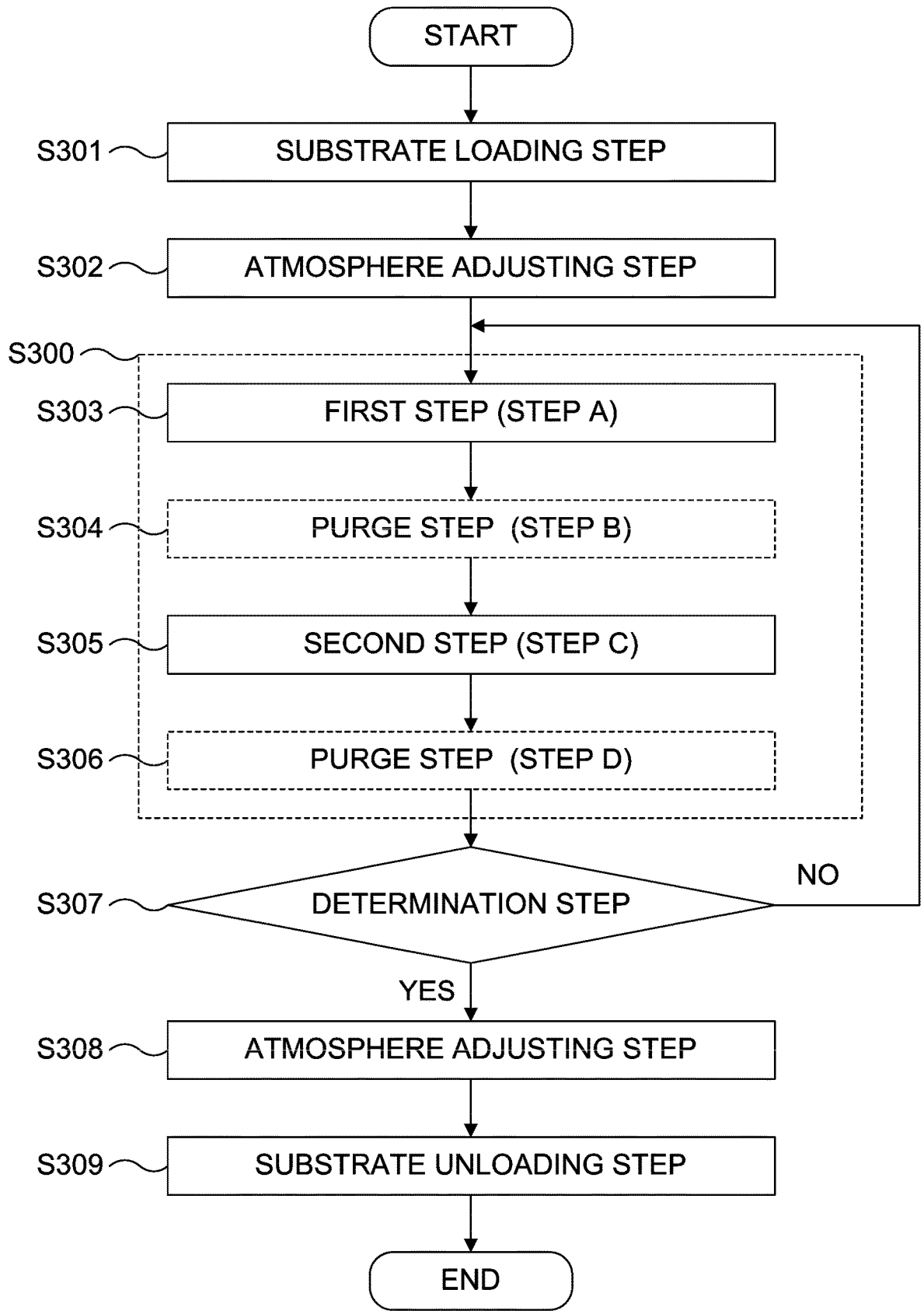
FIG. 9 is a flowchart schematically illustrating a substrate processing preferably performed by the substrate processing apparatus according to the embodiments described herein.
Figure 10:
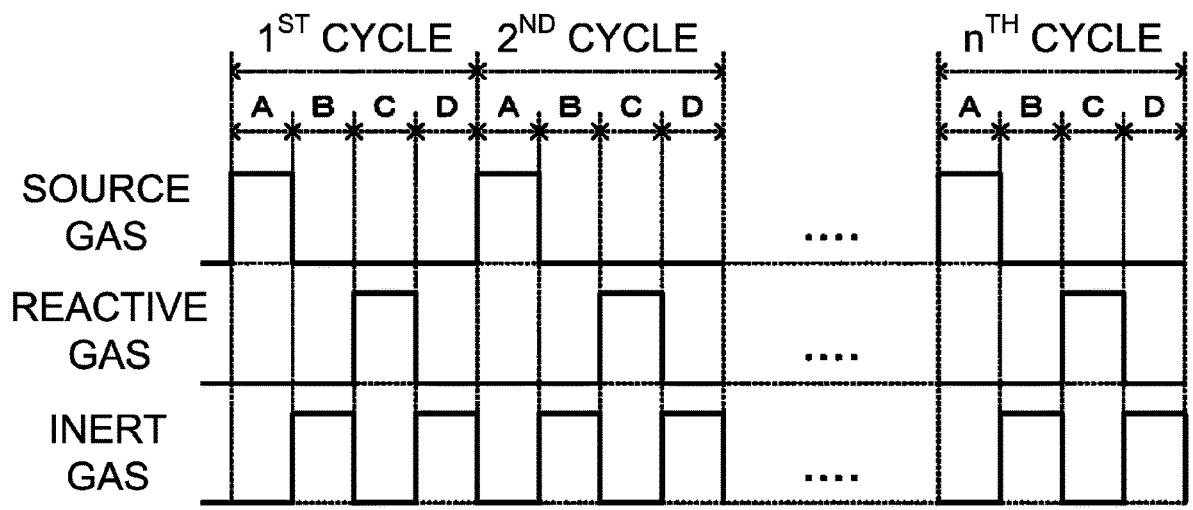
FIG. 10 is a diagram schematically illustrating a film-forming sequence of the substrate processing according to the embodiments described herein.

Hereinafter, as a part of a manufacturing process of a semiconductor device, an exemplary sequence of a substrate processing (also referred to as a "film-forming process") of forming a film containing a predetermined element on the wafer 200 will be described with reference to FIGS. 9 and 10. The substrate processing of forming the film is performed using the substrate processing apparatus 10 described above. In the following description, the operations of the components constituting the substrate processing apparatus 10 are controlled by the controller 121.

The substrate processing (that is, the manufacturing process of the semiconductor device) according to the present embodiments may include a step of forming the film containing the predetermined element on the wafer 200 by performing a cycle a predetermined number of times (n times, n is a natural number equal to or greater than 1), wherein the cycle includes: a step (step "A") of supplying the source gas to the wafer 200 in the process chamber 201; and a step (step "C") of supplying the reactive gas to the wafer 200 in the process chamber 201, and wherein the step A and the step C are performed non-simultaneously.

In the present specification, the term "wafer" may refer to "a wafer itself", or may refer to "a wafer and a stacked structure (aggregated structure) of a predetermined layer (or layers) or a film (or films) formed on a surface of a wafer". In the present specification, the term "a surface of a wafer" may refer to "a surface of a wafer itself", or may refer to "a surface of a predetermined layer or a film formed on a wafer". Thus, in the present specification, "forming a predetermined layer (or film) on a wafer" may refer to "forming a predetermined layer (or film) on a surface of a wafer itself", or may refer to "forming a predetermined layer (or film) on a surface of another layer or another film formed on a wafer". In the present specification, the terms "substrate" and "wafer" may be used as substantially the same meaning. That is, the term "substrate" may be substituted by "wafer" and vice versa.

Substrate Loading Step: S301

The wafers 200 are charged (transferred) into the boat 217 (wafer charging). After the boat 217 is charged with the wafers 200, as shown in FIG. 1, the boat 217 charged with the wafers 200 is elevated by the boat elevator 115 and loaded (transferred) into the process chamber 201 (boat loading). With the boat 217 loaded, the seal cap 219 seals the lower end of the manifold 209 via the O-ring 220b.

Atmosphere Adjusting Step: S302

The vacuum pump 246 vacuum-exhausts the inner atmosphere of the process chamber 201 (that is, the space in which the wafers 200 are accommodated) until the inner pressure of the process chamber 201 reaches and is maintained at a desired pressure (vacuum degree). In the atmosphere adjusting step S302, the inner pressure of the process chamber 201 is measured by the pressure sensor 245, and the APC valve 243 is feedback-controlled based on pressure information measured by the pressure sensor 245 (pressure adjusting). The heater 207 heats the process chamber 201 such that the inner temperature of the process chamber 201 reaches and is maintained at a desired temperature for processing the wafers 200. In the atmosphere adjusting step S302, the amount of the current supplied to the heater 207 is feedback-controlled based on the temperature information detected by the temperature sensor 263 such that the desired temperature distribution of the inner temperature of the process chamber 201 is obtained (temperature adjusting). The rotator 267 rotates the wafers 200 by rotating the boat 217. The vacuum pump 246 continuously vacuum-exhausts the inner atmosphere of the process chamber 201, the heater 207 continuously heats the process chamber 201 (that is, the wafers 200), and the rotator 267 continuously rotates the boat 217 (that is, the wafers 200) until at least a processing (substrate processing) of the wafer 200 is completed. In the atmosphere adjusting step S302, the valve 354 is opened to supply the inert gas into the gas supply pipe 350. The flow rate of the inert gas supplied into the gas supply pipe 350 is adjusted by the MFC 352. The inert gas whose flow rate is adjusted is supplied to the low temperature region (for example, the region below the upper end of the heat insulator 218) in the process chamber 201, and is exhausted through the exhaust pipe 231. For example, the flow rate of the inert gas in the atmosphere adjusting step S302 may be set to a predetermined flow rate ranging from 0.1 slm to 2 slm, preferably from 0.3 slm to 0.5 slm. The flow rate of the inert gas is selected such that at least an inner pressure of the low temperature region in the process chamber 201 is greater than the inner pressure of the wafer arrangement region.

Film-Forming Step: S300

Thereafter, as the film-forming step S300, the following steps, that is, the step A, a step B, the step C and a step D are sequentially performed.

First Step: S303 (Step A)

In the present step, the source gas is supplied to the wafer 200 in the process chamber 201.

Specifically, the valve 314 is opened to supply the source gas into the gas supply pipe 310. After a flow rate of the source gas is adjusted by the MFC 312, the source gas whose flow rate is adjusted is supplied to the wafer processing region in the process chamber 201 through the plurality of gas supply holes 410a. The source gas flows into the exhaust path 206 through the exhaust hole 204a, and is exhausted through the exhaust pipe 231. Thereby, the source gas is supplied to the wafer 200 (source gas supply). In the step S303, the valve 514 may be opened to supply the inert gas into the gas supply pipe 510. After a flow rate of the inert gas is adjusted by the MFC 512, the inert gas whose flow rate is adjusted is supplied into the process chamber 201 with the source gas, and is exhausted through the exhaust pipe 231. In the step S303, in order to prevent the source gas from entering the nozzle 420 (that is, in order to prevent a back flow of the source gas), the valve 524 may be opened to supply the inert gas into the gas supply pipe 520. After the flow rate of the inert gas is adjusted by the MFC 522, the inert gas whose flow rate is adjusted is supplied into the process chamber 201 through the gas supply pipe 320 and the nozzle 420, and is exhausted through the exhaust pipe 231.

In the step S303, the valve 354 is opened to supply the inert gas into the gas supply pipe 350. After the flow rate of the inert gas is adjusted by the MFC 352, the inert gas whose flow rate is adjusted is supplied to the low temperature region in the process chamber 201, and is exhausted through the exhaust pipe 231.

For example, process conditions of the present step are as follows:

A process pressure: from 1 Pa to 1,000 Pa, preferably from 1 Pa to 100 Pa, more preferably from 10 Pa to 50 Pa;

A supply flow rate of the source gas: from 10 sccm to 2,000 sccm, preferably from 50 sccm to 1,000 sccm, more preferably from 100 sccm to 500 sccm;

A supply time (time duration) of supplying the source gas: from 1 second to 60 seconds, preferably from 1 second to 20 seconds, more preferably from 2 seconds to 15 seconds;

A supply flow rate of the inert gas (for each gas supply pipe): from 1 slm to 30 slm, preferably from 1 slm to 20 slm, more preferably from 1 slm to 10 slm; and A process temperature: from room temperature (25° C.) to 600° C., preferably from 90° C. to 550° C., more preferably from 450° C. to 550° C.

A lower limit of the process temperature in the present step may be appropriately changed depending on a type of the reactive gas used in the step C described later.

In the present specification, for example, a numerical range such as "from 1 Pa to 1,000 Pa" refers to a range that a lower limit and an upper limit are included in the numerical range. Therefore, for example, the numerical range "from 1 Pa to 1,000 Pa" means a range equal to or more than 1 Pa and equal to or less than 1,000 Pa. The same also applies to other numerical ranges described herein.

By supplying the source gas to the wafer 200 according to the above-described process conditions, a predetermined element-containing layer serving as a first layer is formed on an outermost surface of the wafer 200.

The source gas supplied into the process chamber 201 is not only supplied to the wafer 200, but also supplied on a surface of a component in the process chamber 201 such as the inner wall of the inner tube 204, surfaces of the nozzles 410 and 420, a surface of the boat 217, an inner wall of the manifold 209, the upper surface of the seal cap 219, a side surface of the rotating shaft 255, the upper surface and a side surface of the heat insulator 218. When the source gas supplied into the process chamber 201 comes into contact with the surface of the component in the process chamber 201, the predetermined element-containing layer described above is formed not only on the wafer 200 but also on the surface of the component in the process chamber 201. In addition, reaction by-products may be deposited on the surface of the component in the process chamber 201. Thereby, the by-products subject to the cleaning process described later may adhere to the surface of the component in the process chamber 201.

However, according to the substrate processing apparatus 10 in the present embodiments, by providing the auxiliary chamber cover such as the first cover 1001 configured to cover the auxiliary chamber 201a, it is possible to narrow the flow path of the source gas that may enter the low temperature region through a space between the inner wall of the auxiliary chamber 201a and the outer peripheral surface (side wall) of the heat insulator 218. As a result, it is possible to prevent (or suppress) the source gas from entering the low temperature region from the wafer processing region. Thereby, it possible to suppress the adhesion of the by-products to the surface of the component in the low temperature region in the process chamber 201.

In addition, by supplying the inert gas to the low temperature region through the gas supply pipe 350 to supply the inert gas into the wafer arrangement region through a gap provided between the auxiliary chamber cover such as the first cover 1001 and the outer peripheral surface of the heat insulator 218, it is possible to more reliably prevent (or suppress) the source gas from entering the low temperature region through the gap between the auxiliary chamber cover and the outer peripheral surface of the heat insulator 218.

After the first layer is formed, the valve 314 is closed to stop the supply of the source gas into the process chamber 201. When the valve 314 is closed, the APC valve 243 is left open.

For example, a gas containing silicon (Si) as a predetermined element may be used as the source gas. For example, a chlorosilane-based gas such as monochlorosilane (SiH3Cl, abbreviated as MCS) gas, dichlorosilane (SiH2Cl2, abbreviated as DCS) gas, trichlorosilane (SiHCl3, abbreviated as TCS) gas, tetrachlorosilane (SiCl4, abbreviated as STC) gas, hexachlorodisilane gas (Si2Cl6, abbreviated as HCDS) gas and octachlorotrisilane (Si3Cl8, abbreviated as OCTS) gas may be used as the source gas. For example, a fluorosilane-based gas such as tetrafluorosilane (SiF4) gas and difluorosilane (SiH2F2) gas, a bromosilane-based gas such as tetrabromosilane (SiBr4) gas and dibromosilane (SiH2Br2) gas, or an iodine silane-based gas such as tetraiodide silane (SiI4) gas and diiodosilane (SiH2I2) gas may be used as the source gas. For example, an aminosilane-based gas such as tetrakis(dimethylamino)silane (Si[N(CH3)2]4, abbreviated as 4DMAS) gas, tris(dimethylamino)silane (Si[N(CH3)2]3H, abbreviated as 3DMAS) gas, bis(diethylamino)silane (Si[N(C2H5)2]2H2, abbreviated as BDEAS) gas and bis (tertiarybutylamino) silane (SiH2[NH(C4H9)]2, abbreviated as BTBAS) gas may be used as the source gas. For example, a gas containing aluminum (Al) (which is a metal element) as a predetermined element may be used as the source gas. For example, an organic aluminum-containing gas such as trimethylaluminum (Al(CH3)3, abbreviated as TMA) gas may be used as the source gas. Further, for example, a halogen-based aluminum-containing gas such as aluminum chloride (AlCl3) gas may be used as the source gas. One or more of the gases described above may be used as the source gas.

As the inert gas, for example, instead of nitrogen (N2) gas or in addition to the N2 gas, a rare gas such as argon (Ar) gas, helium (He) gas, neon (Ne) gas and xenon (Xe) gas may be used. For example, one or more of the gases described above may be used as the inert gas. The same also applies to each of the step B, the step C and the step D described later.

Purge Step: S304 (Step B)

After the step A is completed, with the APC valve 243 open, the vacuum pump 246 vacuum-exhausts the inner atmosphere of the process chamber 201 to remove a residual source gas in the process chamber 201 which did not react or which contributed to the formation of the predetermined element-containing layer from the process chamber 201 (residual gas removing). In the step S304, with the valves 514 and 524 open, the inert gas may be supplied into the process chamber 201 through the nozzles 410 and 420. The inert gas supplied through the valves 514 and 524 serves as the purge gas. In the step S304, the inert gas supplied through the valves 514 and 524 may be constantly (that is, continuously) supplied or may be intermittently (that is, in a pulse-wise manner) supplied.

Second Step: S305 (Step C)

After the step B is completed, the reactive gas is supplied to the wafer 200 in the process chamber 201, that is, the first layer formed on the wafer 200.

Specifically, the valve 324 is opened to supply the reactive gas into the gas supply pipe 320. After a flow rate of the reactive gas is adjusted by the MFC 322, the reactive gas whose flow rate is adjusted is supplied to the wafer processing region in the process chamber 201 through the plurality of gas supply holes 420a. The reactive gas flows into the exhaust path 206 through the exhaust hole 204a, and is exhausted through the exhaust pipe 231. Thereby, the reactive gas is supplied to the wafer 200 (reactive gas supply). In the step S305, the valve 524 may be opened to supply the inert gas into the gas supply pipe 520. After the flow rate of the inert gas is adjusted by the MFC 522, the inert gas whose flow rate is adjusted is supplied into the process chamber 201 with the reactive gas, and is exhausted through the exhaust pipe 231. In the step S305, in order to prevent the reactive gas from entering the nozzle 410, the valve 514 may be opened to supply the inert gas into the gas supply pipe 510. After the flow rate of the inert gas is adjusted by the MFC 512, the inert gas whose flow rate is adjusted is supplied into the process chamber 201 through the gas supply pipe 310 and the nozzle 410, and is exhausted through the exhaust pipe 231.

In the step S305, the valve 354 is opened to supply the inert gas into the gas supply pipe 350. After the flow rate of the inert gas is adjusted by the MFC 352, the inert gas whose flow rate is adjusted is supplied to the low temperature region in the process chamber 201, and is exhausted through the exhaust pipe 231.

For example, process conditions of the present step are as follows:

A supply flow rate of the reactive gas: from 0.01 slm to 40 slm, preferably from 5 slm to 30 slm, more preferably from 10 slm to 20 slm;

A supply time (time duration) of supplying the reactive gas: from 0.01 second to 90 seconds, preferably from 0.01 second to 30 seconds, more preferably from 0.1 second to 20 seconds; and A process pressure: from 1 Pa to 1,000 Pa, preferably from 1 Pa to 100 Pa, more preferably from 10 Pa to 50 Pa.

The other process conditions of the present step are the same as the process conditions of the step A.

By supplying the reactive gas onto the wafer 200 in the process chamber 201 according to the above-described process conditions, the reactive gas reacts with at least a portion of the first layer (that is, the predetermined element-containing layer) formed on the wafer 200. As a result, at least the portion of the first layer is modified (changed). By modifying the first layer, a modified layer containing the predetermined element (hereinafter, also simply referred to as a "modification layer") is formed on the wafer 200 as a second layer. For example, when the oxidizing gas is used as the reactive gas, by modifying (oxidizing) the first layer, a layer containing the predetermined element and oxygen (O) (that is, an oxide layer containing the predetermined element (hereinafter, also simply referred to as "an oxide layer")) is formed on the wafer 200 as the second layer.

The reactive gas supplied into the process chamber 201 is not only supplied to the wafer 200, but also supplied on the surface of the component in the process chamber 201 described above. When the reactive gas supplied into the process chamber 201 comes into contact with the predetermined element-containing layer formed on the surface of the component in the process chamber 201, similar to the predetermined element-containing layer formed on the wafer 200, at least a portion of the predetermined element-containing layer formed on the surface of the component in the process chamber 201 is modified (changed) into the modification layer containing the predetermined element.

Similar to the step A, according to the present step, by providing the auxiliary chamber cover such as the first cover 1001 configured to cover the auxiliary chamber 201a, it is possible to prevent (or suppress) the reactive gas from entering the low temperature region from the wafer processing region. Thereby, it possible to suppress the adhesion of the by-products to the surface of the component in the low temperature region in the process chamber 201.

Similar to the step A, according to the present step, by supplying the inert gas into the wafer processing region through the gap provided between the auxiliary chamber cover such as the first cover 1001 and the outer peripheral surface (side wall) of the heat insulator 218, it is possible to more reliably prevent (or suppress) the reactive gas from entering the low temperature region through the gap between the auxiliary chamber cover and the outer peripheral surface of the heat insulator 218. Thereby, it possible to suppress the adhesion of the by-products to the surface of the component in the low temperature region in the process chamber 201.

After the second layer is formed, the valve 324 is closed to stop the supply of the reactive gas into the process chamber 201. When the valve 324 is closed, the APC valve 243 is left open.

For example, a gas such as oxygen (O2) gas, nitrous oxide (N2O) gas, nitrogen monoxide (NO) gas, nitrogen dioxide (NO2) gas, ozone (O3) gas, water vapor (H2O) gas, hydrogen peroxide (H2O2) gas, carbon monoxide (CO) gas, carbon dioxide (CO2) gas, plasma-excited O2 gas (O2*) and a mixed gas of the plasma-excited O2 gas (O2*) and plasma-excited hydrogen (H2) gas (H2*) may be used as the oxidizing gas (that is, the reactive gas). For example, a gas such as ammonia (NH3) gas, hydrazine (N2H4) gas, diazene (N2H2) gas and N3H8 gas may be used as the nitriding gas (that is, the reactive gas). One or more of the gases described above may be used as the reactive gas.

For example, when a silicon-containing gas is used as the source gas and the oxidizing gas is used as the reactive gas, as the film, it is possible to form a silicon oxide film (SiO film) on the wafer 200. For example, when the silicon-containing gas is used as the source gas and the nitriding gas is used as the reactive gas, as the film, it is possible to form a silicon nitride film (SiN film) on the wafer 200. For example, when the silicon-containing gas is used as the source gas and the oxidizing gas and the nitriding gas are used as the reactive gas, as the film, it is possible to form a silicon oxynitride film (SiON film) on the wafer 200. Further, for example, when an aluminum-containing gas is used as the source gas and the oxidizing gas is used as the reactive gas, as the film, it is possible to form an aluminum oxide film (AlO film) on the wafer 200. Further, for example, when the aluminum-containing gas is used as the source gas and the nitriding gas is used as the reactive gas, as the film, it is possible to form an aluminum nitride film (AlN film) on the wafer 200.

Purge Step: S306 (Step D)

After the step C is completed, a residual substance in the process chamber 201 such as the reaction by-products and the reactive gas which did not react or which contributed to the formation of the modification layer is removed from the process chamber 201 in the same manners as in the step B.

Determination Step (Performing Predetermined Number of Times): S307

By performing the cycle wherein the step A through the step D described above are performed sequentially (non-simultaneously or without overlapping) in this order at least once (n times), it is possible to form a modified film containing the predetermined element of a desired composition and a desired thickness (also simply referred to as a "modification film") on the wafer 200. For example, when the oxidizing gas is used as the reactive gas, a film containing the predetermined element and oxygen, that is, an oxide film containing the predetermined element (hereinafter, also simply referred to as an "oxide film") is formed on the wafer 200. It is preferable that the cycle is performed a plurality of times. That is, it is preferable that the cycle is repeatedly performed until the modification film is obtained by controlling the second layer formed in each cycle to be thinner than the modification film of the desired thickness and by stacking the second layer by repeatedly performing the cycle. In the determination step S307, the controller 121 determines whether the cycle is performed a predetermined number of times (n times). When the controller 121 determines, in the determination step S307, that the cycle is performed the predetermined number of times ("YES" in FIG. 9), the film-forming step S300 is terminated. When the controller 121 determines, in the determination step S307, that the cycle is not performed the predetermined number of times ("NO" in FIG. 9), the film-forming step S300 is performed again.

Atmosphere Adjusting Step: S308

After the film-forming step S300 is completed, the inert gas serving as the purge gas is supplied into the process chamber 201 through each of the nozzles 410 and 420, and then the inert gas supplied into the process chamber 201 is exhausted through the exhaust hole 204a, the exhaust path 206 and the exhaust pipe 231. Thereby, the inner atmosphere of the process chamber 201 is purged with the inert gas, and a residual gas in the process chamber 201 or the reaction by-products remaining in the process chamber 201 are removed from the process chamber 201 (after-purge). Thereafter, the inner atmosphere of the process chamber 201 is replaced with the inert gas (substitution by inert gas), and the inner pressure of the process chamber 201 is returned to the normal pressure (atmospheric pressure) (returning to atmospheric pressure).

Substrate Unloading Step: S309

Thereafter, the seal cap 219 is lowered by the boat elevator 115 and the lower end opening of the manifold 209 is opened. The boat 217 with the processed wafers 200 charged therein is unloaded out of the inner tube 204 (that is, the reaction tube) through the lower end opening of the manifold 209 (boat unloading). After the boat 217 is unloaded out of the inner tube 204, the processed wafers 200 are discharged (transferred) from the boat 217 (wafer discharging).

The by-products adhering to the surface of the component in the process chamber 201 by performing the film-forming process described above are removed by the cleaning process performed after the film-forming process. For example, the cleaning process can be performed by supplying a cleaning gas into the process chamber 201 through at least one among the nozzles 410 and 420. In the cleaning process, a temperature of the cleaning process is elevated to activate the cleaning gas, and the by-products adhering to the surface of the component in the process chamber 201 are removed by the activated cleaning gas.

OTHER EMBODIMENTS

While the technique is described in detail by way of the embodiments described above, the above-described technique is not limited thereto. The above-described technique may be modified in various ways without departing from the scope thereof.

For example, the above-described embodiments are described by way of an example in which the reaction tube is constituted by the outer tube 203 and the inner tube 204. However, the above-described technique is not limited thereto. For example, the above-described technique may also be applied when the reaction tube is constituted by the outer tube 203 without including the inner tube 204. In such a case, the auxiliary chamber 201a may be provided in the outer tube 203. Further, it is preferable that the exhaust pipe 231 is connected to the outer tube 203 that horizontally surrounds a region above the low temperature region, that is, the high temperature region. Even in such a case, it is possible to obtain substantially the same effects according to the embodiments described above.

For example, the above-described embodiments are described by way of an example in which the source gas and the reactive gas are supplied alternately and non-simultaneously. However, the above-described technique is not limited thereto. For example, the above-described technique may also be applied when the source gas and the reactive gas are supplied simultaneously.

For example, the above-described embodiments are described by way of an example in which the film containing silicon or aluminum as the predetermined element is formed on the wafer. However, the above-described technique is not limited thereto. For example, the above-described technique may also be applied when a metal element such as titanium (Ti), zirconium (Zr), hafnium (Hf), tantalum (Ta), niobium (Nb), molybdenum (Mo), tungsten (W), yttrium (Y), lanthanum (La) and strontium (Sr) is used as the predetermined element or a metalloid element (semiconductor element) such as germanium (Ge) is used as the predetermined element to form the film containing the predetermined element on the substrate (wafer). That is, the substrate processing apparatus 10 according to the above-described technique may also be preferably applied to form a film containing the metal element or the metalloid element such as a nitride film, a carbon nitride film, an oxide film, a carbon oxide film, a nitrogen oxide film, a carbon oxynitride film, a boron nitride film, a boron carbonitride film and a film containing the metal element alone on the wafer.

For example, the above-described embodiments are described by way of an example in which a batch type substrate processing apparatus configured to simultaneously process a plurality of substrates is used to form the film. However, the above-described technique is not limited thereto. For example, the above-described technique may be applied when a single wafer type substrate processing apparatus configured to process one or several substrates at a time is used to form the film. For example, the above-described embodiments are described by way of an example in which a substrate processing apparatus including a hot wall type process furnace is used to form the film. However, the above-described technique is not limited thereto. For example, the above-described technique may be applied when a substrate processing apparatus including a cold wall type process furnace is used to form the film.

The process sequences and the process conditions of the substrate processing using the substrate processing apparatuses described above may be substantially the same as those of the above-described embodiments. Even in such a case, it is possible to obtain substantially the same effects according to the embodiment described above.

The embodiments described above and modified examples described above may be appropriately combined. In addition, the process sequences and the process conditions of each step of each combination thereof may be substantially the same as those of each step of the embodiments described above.

As described above, according to some embodiments in the present disclosure, it is possible to suppressing the adhesion of the deposits to an inside of the reaction vessel during the substrate processing using the substrate processing apparatus.

What is claimed is:

1. A substrate processing apparatus comprising:
a reaction vessel configured to be capable of accommodating a substrate retainer provided with a substrate support region in which a substrate is supported and a heat insulator provided below the substrate support region;
an auxiliary chamber provided in the reaction vessel and extending along an extending direction from at least a position below an upper end of the heat insulator to a position facing the substrate support region; and
a first inner plate provided in the auxiliary chamber along a plane perpendicular to the extending direction of the auxiliary chamber so as to divide an inner space of the auxiliary chamber,
wherein a first gap is provided between an outer periphery of the heat insulator and an edge of the first inner plate,
a second gap is provided between the outer periphery of the heat insulator and at least a portion of an inner wall of the reaction vessel on which the auxiliary chamber is not provided, and
the first gap and the second gap are substantially equal.

2. The substrate processing apparatus of claim 1, wherein the auxiliary chamber is configured to protrude outward from the reaction vessel.

3. The substrate processing apparatus of claim 1, wherein the reaction vessel is of a cylindrical shape.

4. The substrate processing apparatus of claim 1, wherein the first inner plate is located at a same height as the upper end of the heat insulator.

5. The substrate processing apparatus of claim 1, wherein the first inner plate is located above the upper end of the heat insulator.

6. The substrate processing apparatus of claim 1, wherein the first inner plate is located below the upper end of the heat insulator.

7. The substrate processing apparatus of claim 1, further comprising:
   a gas supply nozzle provided in the auxiliary chamber.

8. The substrate processing apparatus of claim 7, wherein the first inner plate is located lower than a lowermost hole among a plurality of holes provided at the gas supply nozzle.

9. The substrate processing apparatus of claim 1, further comprising:
   a second cover provided along the extending direction of the auxiliary chamber and extending downward from the edge of the first inner plate facing the heat insulator so as to cover an opening of the auxiliary chamber.

10. The substrate processing apparatus of claim 9, further comprising:
    a third inner plate provided in the auxiliary chamber at a position corresponding to a lower end of the second cover along the plane perpendicular to the extending direction of the auxiliary chamber.

11. The substrate processing apparatus of claim 10, further comprising:
    a third outer plate provided to overlap at least a part of the third inner plate.

12. The substrate processing apparatus of claim 1, further comprising:
    a gas supply nozzle provided in the auxiliary chamber,
    wherein the first inner plate is provided with a notch engaged with the gas supply nozzle.

13. The substrate processing apparatus of claim 12, further comprising:
    an inert gas supplier configured to supply an inert gas to a space below the heat insulator,
    wherein the auxiliary chamber communicates with the space below the heat insulator to which the inert gas is supplied, and
    the first inner plate is provided with the notch for the inert gas supplied into the auxiliary chamber to be ejected into a space above the upper end of the heat insulator.

14. The substrate processing apparatus of claim 1, further comprising:
    a first outer plate provided to overlap at least a part of the first inner plate.

* * * * *